United States Patent
Soeya et al.

(10) Patent No.: US 9,082,970 B2
(45) Date of Patent: Jul. 14, 2015

(54) PHASE-CHANGE MEMORY AND SEMICONDUCTOR RECORDING/REPRODUCING DEVICE

(71) Applicant: National Institute of Advanced Industrial Science and Technology, Tokyo (JP)

(72) Inventors: Susumu Soeya, Ibaraki (JP); Takahiro Odaka, Ibaraki (JP); Toshimichi Shintani, Ibaraki (JP); Junji Tominaga, Ibaraki (JP)

(73) Assignee: Hitachi, Ltd., Tokyo (JP)

( * ) Notice: Subject to any disclaimer, the term of this patent is extended or adjusted under 35 U.S.C. 154(b) by 39 days.

(21) Appl. No.: 14/050,987

(22) Filed: Oct. 10, 2013

(65) Prior Publication Data
US 2014/0252304 A1    Sep. 11, 2014

(30) Foreign Application Priority Data
Mar. 11, 2013   (JP) ................... 2013-048050

(51) Int. Cl.
| | |
|---|---|
| H01L 45/00 | (2006.01) |
| C30B 29/46 | (2006.01) |
| C30B 29/68 | (2006.01) |
| H01L 27/24 | (2006.01) |

(52) U.S. Cl.
CPC .............. *H01L 45/144* (2013.01); *C30B 29/46* (2013.01); *C30B 29/68* (2013.01); *H01L 27/2436* (2013.01); *H01L 45/06* (2013.01); *H01L 45/1625* (2013.01); *Y10T 428/24975* (2015.01)

(58) Field of Classification Search
CPC ............................... H01L 29/02; H01L 45/00
USPC ........... 257/2, 3, 4, E21.35; 438/95, 96, 135, 438/166
See application file for complete search history.

(56) References Cited

U.S. PATENT DOCUMENTS 8,335,106 B2 * 12/2012 Aizawa et al. ............... 365/174
8,742,514 B2 *  6/2014 Suh et al. ..................... 257/382

(Continued)

FOREIGN PATENT DOCUMENTS

| JP | 2010-263131 A | 11/2010 |
|---|---|---|
| JP | 2013-175570 A | 9/2013 |

OTHER PUBLICATIONS

Simpson et al., Nature Nanotechnology 6, 501 (2011).

(Continued)

*Primary Examiner* — Caleb Henry
(74) *Attorney, Agent, or Firm* — McCormick, Paulding & Huber LLP

(57) ABSTRACT

A phase-change memory and a semiconductor recording reproducing device capable of reducing consumed power are provided. A $Sn_xTe_{100-x}/Sb_2Te_3$ SL film obtained by depositing a $Sn_xTe_{100-x}$ film and a $Sb_2Te_3$ film layer by layer contains a $SnTe/Sb_2Te_3$ superlattice phase formed of SnTe and $Sb_2Te_3$, a SnSbTe alloy phase, and a Te phase. The $SnTe/Sb_2Te_3$ superlattice phase is diluted by the SnSbTe alloy phase and the Te phase. Here, X of the $Sn_xTe_{100-x}$ film is represented by 4 at. %≤X≤55 at. %.

16 Claims, 29 Drawing Sheets

(56) References Cited

U.S. PATENT DOCUMENTS

| | | | |
|---|---|---|---|
| 2006/0039192 A1* | 2/2006 | Ha et al. ........................ | 365/163 |
| 2006/0266993 A1* | 11/2006 | Suh et al. ......................... | 257/4 |
| 2007/0108488 A1* | 5/2007 | Suh et al. ...................... | 257/295 |
| 2010/0200828 A1* | 8/2010 | Tominaga et al. ................ | 257/2 |
| 2010/0207090 A1* | 8/2010 | Tominaga et al. ................ | 257/2 |
| 2011/0042626 A1* | 2/2011 | Enomura ...................... | 252/514 |
| 2011/0049457 A1* | 3/2011 | Kang et al. ........................ | 257/2 |
| 2011/0049458 A1* | 3/2011 | Ahn et al. ........................ | 257/2 |
| 2011/0147692 A1* | 6/2011 | Park et al. ........................ | 257/2 |
| 2011/0186800 A1* | 8/2011 | Schrott et al. ..................... | 257/3 |
| 2012/0119181 A1* | 5/2012 | Oh et al. .......................... | 257/4 |
| 2012/0127789 A1* | 5/2012 | Suh et al. ...................... | 365/163 |
| 2012/0187360 A1* | 7/2012 | Eungyoon ........................ | 257/2 |
| 2013/0017664 A1* | 1/2013 | Hampton ...................... | 438/382 |
| 2013/0075682 A1* | 3/2013 | Lee .................................. | 257/2 |
| 2013/0181182 A1* | 7/2013 | Perniola et al. ................... | 257/4 |
| 2013/0221310 A1* | 8/2013 | Morikawa et al. ................ | 257/2 |
| 2013/0313504 A1* | 11/2013 | Park ................................. | 257/4 |
| 2014/0110658 A1* | 4/2014 | Redaelli .......................... | 257/4 |
| 2014/0198565 A1* | 7/2014 | Pellizzer et al. .............. | 365/163 |

OTHER PUBLICATIONS

Tominaga et al., Proceeding of the IEEE International Electron Device Meeting, San Francisco (2010) pp. 22.3.1-22.3.4.
Soeya et al., Journal of Applied Physics 112, 034301 (2012).
Soeya et al., Phase Change Oriented Science PCOS2012, (2012).

* cited by examiner

PHASE-CHANGE MEMORY AND SEMICONDUCTOR RECORDING/REPRODUCING DEVICE

CROSS-REFERENCE TO RELATED APPLICATION

The present application claims priority from Japanese Patent Application No. 2013-48050 filed on Mar. 11, 2013, the content of which is hereby incorporated by reference into this application.

TECHNICAL FIELD OF THE INVENTION

The present invention relates to a phase-change memory and a semiconductor recording/reproducing device.

BACKGROUND OF THE INVENTION

Phase-change memory is promising as a next-generation non-volatile memory (hereinafter, abbreviated as PCRAM: Phase-Change Random Access Memory) because it is superior in scaling of element size and endurance. However, PCRAM has a problem of high reset current.

To solve this problem, superlattice phase-change memory (hereinafter, abbreviated as SL phase-change memory) composed of GeTe(111)/$Sb_2Te_3$(001) superlattice film and called "interfacial Phase-Change Memory (iPCM)" has been suggested. Such a SL phase-change memory, as compared with PCRM an operation mechanism of which is phase-changes between "amorphous" and "crystal", can reduce switching power to about one tenth ($1/10$) according to first-principle computer simulations and verification experiments.

According to Simpson et al., Nature Nanotechnology 6, 401 (2011) (Non-Patent Document 1), Tominaga et al., Proceeding of the IEEE International Electron Device Meeting, San Francisco (2010), pp. 22.3.1-22.3.4 (Non-Patent Document 2) and Japanese Patent Application Laid-Open Publication No. 2010-263131 (Patent Document 1), operation principle of the SL phase-change memory using a superlattice formed of GeTe(111) and $Sb_2Te_3$(001) is to reversibly change Ge atoms between "the octahedral sites (or 6-fold bond state)" and "the tetrahedral sites (or 4-fold bond state)" by an applied voltage or current. This change will be called "Ge switching" in the present specification. In addition, the SL phase-change memory using a superlattice formed of GeTe (111) and $Sb_2Te_3$(001) will be called in a simple manner as GeTe(111)/$Sb_2Te_3$(001).

These Documents mentioned above disclose that, since the SL phase-change memory exhibits a low resistance when Ge atoms are at the octahedral sites while it exhibits a high resistance when Ge atoms are at tetrahedral sites, it is possible to make the SL phase-change memory function in a set state when it is in a low-resistance state and function in a reset state when it is in a high-resistance state. That is, by the SL phase-change memory, information can be memorized by making a correspondence between the low-resistance state and the low-resistance state and "0" and "1", which are digital values, respectively.

According to these Documents mentioned above, a $Sb_2Te_3$ (001) layer is formed by layer-by-layer deposition of a Te (tellurium) layer and a Sb (antimony) layer in $Sb_2Te_3$[001] except for a Te—Te weak bond portion where a van der Waals gap layer is present. On the other hand, the GeTe(111) layer is formed by layer-by-layer deposition of a Te layer and a Ge (germanium) layer except for a deposited portion of a Te layer-Te layer where a vacancy layer exists.

Further, Patent Document 1 mentioned above discloses that, upon "Ge switching", lattice (or crystalline lattice) modification between the 6-fold bond state of Ge atoms in which the deposited state in GeTe[111] direction is "—Ge layer-Te layer-vacancy layer-Te layer-Ge layer-" and the 4-fold bond state of Ge atoms in which the deposited state in GeTe[111] direction is "—Te layer-Ge layer-vacancy layer-Ge layer-Te layer-" is induced and it enables a low switching power of the SL phase-change memory. Here, the 6-fold bond state of Ge atoms corresponds to the low-resistance state and the 4-fold bond state of Ge atoms corresponds to the high-resistance state.

SUMMARY OF THE INVENTION

Phase-change memory represented by GST225 which is currently being commercialized has an operation principle of generating phase-changes between "amorphous" state and "crystal" state in a recording/reproducing film. However, consumed power, represented by switching power, of this type of phase-change memory is high and thus reduction of consumed powers is demanded.

As to this point, while the GeTe(111)/$Sb_2Te_3$(001) SL phase-change memory described above has been proposed and the capability of a reduction of switching power to about one tenth as compared with that of GST225 that is an existing phase-change memory has been substantiated, further reduction of consumed power is demanded.

Accordingly, a preferred aim of the present invention is to provide a superlattice (SL) phase-change memory and a semiconductor recording/reproducing device capable of achieving low consumed power.

The above and other problems and novel characteristics of the present invention will be apparent from the description of the present specification and the accompanying drawings.

A phase-change memory according to an embodiment includes a recording/reproducing film containing Sn (tin), Sb (antimony), and Te (tellurium). Here, the recording/reproducing film contains a SnTe/$Sb_2Te_3$ superlattice phase, a SnSbTe alloy phase, and a Te phase.

In addition, the phase-change memory according to an embodiment includes a recording/reproducing film containing Sn, Sb, and Te. The recording/reproducing film contains at least a SnTe/$Sb_2Te_3$ superlattice phase formed of SnTe and $Sb_2Te_3$.

A phase-change memory according to an embodiment includes a recording/reproducing film containing Sn, Sb, and Te. The recording/reproducing film contains at least a SnSbTe alloy phase.

Further, a phase-change memory according to an embodiment includes a recording/reproducing film containing Sn, Sb, and Te and obtained by depositing a $Sn_xTe_{100-x}$ film and a $Sb_2Te_3$ film layer by layer. The recording/reproducing film contains a SnTe/$Sb_2Te_3$ superlattice phase formed of SnTe and $Sb_2Te_3$, a SnSbTe alloy phase, and a Te phase.

A semiconductor recording/reproducing device according to an embodiment includes a plurality of memory cells, each of which includes (a) a select transistor for selecting a memory cell and (b) a memory unit electrically connected to the select transistor and including a recording/reproducing film containing Sn, Sb, and Te. Here, the recording/reproducing film contains a SnTe/$Sb_2Te_3$ superlattice phase formed of SnTe and $Sb_2Te_3$, a SnSbTe alloy phase, and a Te phase.

Further, a semiconductor recording/reproducing device according to an embodiment includes a plurality of memory cells, each of which includes (a) a select transistor for selecting a memory cell and (b) a memory unit electrically connected to the select transistor and including a recording/reproducing film containing Sn, Sb, and Te. Here, the recording/reproducing film contains at least a SnTe/Sb$_2$Te$_3$ superlattice phase formed of SnTe and Sb$_2$Te$_3$. 020 Further, a semiconductor recording/reproducing device according to an embodiment includes a plurality of memory cells, each of which includes (a) a select transistor for selecting a memory cell and (b) a memory unit electrically connected to the select transistor and including a recording/reproducing film containing Sn, Sb, and Te. Here, the recording/reproducing film contains at least a SnSbTe alloy phase.

Moreover, a semiconductor recording/reproducing device according to an embodiment includes a plurality of memory cells, each of which includes (a) a select transistor for selecting a memory cell and (b) a memory unit electrically connected to the select transistor and including a recording/reproducing film containing Sn, Sb, and Te and obtained by depositing a Sn$_x$Te$_{100-x}$ film and a Sb$_2$Te$_3$ film layer by layer. The recording/reproducing film contains a SnTe/Sb$_2$Te$_3$ superlattice phase formed of SnTe and Sb$_2$Te$_3$, a SnSbTe alloy phase, and a Te phase.

According to an embodiment, a superlattice (SL) phase-change memory and a semiconductor recording/reproducing device achieving consumed-power reduction can be provided. For example, the SL phase-change memory according to an embodiment can reduce consumed power to about one seven-thousand-and-seventieth (1/7070) as compared with an existing phase-change memory.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference symbols throughout the drawings for describing the embodiments, and the repetitive description thereof is omitted. Also, in some drawings used in the embodiments, hatching is used even in a plan view so as to make the drawings easy to understand.

(First Embodiment)

<Configuration of Memory Unit in Phase-Change Memory>

Figure 1:
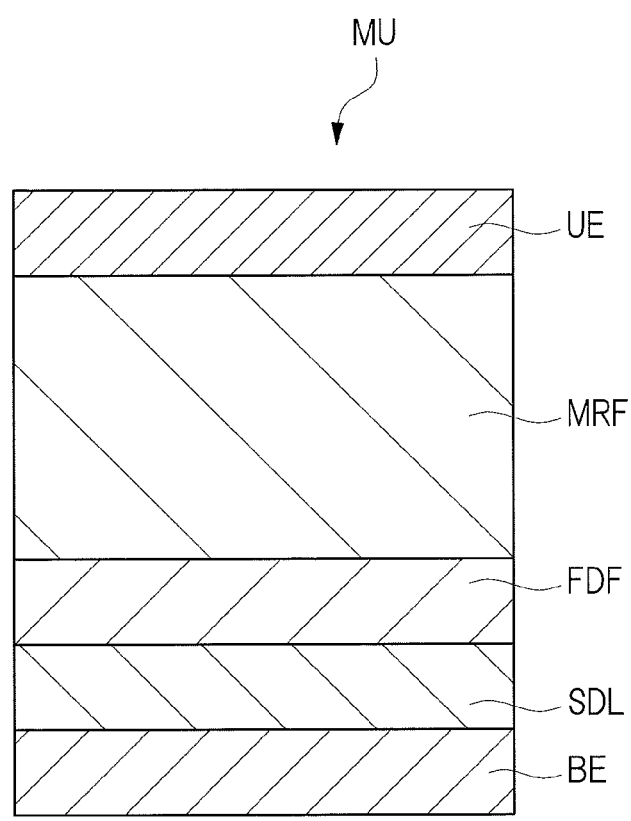
FIG. 1 is a cross-sectional view illustrating a schematic configuration of a memory unit that is a main part of a phase-change memory according to a first embodiment.

FIG. 1 is a cross-sectional view illustrating a schematic configuration of a memory unit that is a main portion of a phase-change memory according to a first embodiment. As illustrated in FIG. 1, a memory unit MU includes a lower electrode BE and a seed layer SDL is formed on the lower electrode BE. An underlayer FDF is formed on the seed layer SDL and a recording/reproducing film MRF is formed on the underlayer FDF. Further, an upper electrode UE is formed on the recording/reproducing film MRF. These films can be formed by, for example, a sputtering method (or sputter-deposition method).

The lower electrode BE is formed of, for example, a tungsten film (W film) and has a thickness of, for example, 100 nm. The seed layer SDL is formed of, for example, a titanium nitride film (TiN film) and has a thickness of, for example, 1 nm. This seed layer SDL has a function of making the underlayer FDF and the recording/reproducing film MRF, which are formed above the underlayer FDF, oriented with their closed packed crystalline sheets. Further, the underlayer FDF is formed is formed of, for example, a $Sb_2Te_3$ film and has a thickness of, for example, 10 nm. In the same manner as the seed layer SDL described above, this underlayer FDF also has a function of making the recording/reproducing film MRF, which is formed above the underlayer FDF, oriented with its closed packed crystalline sheet. Moreover, the upper electrode UE formed on the recording/reproducing film MRF is formed of, for example, a tungsten film and has a thickness of, for example, 50 nm.

Figure 2:
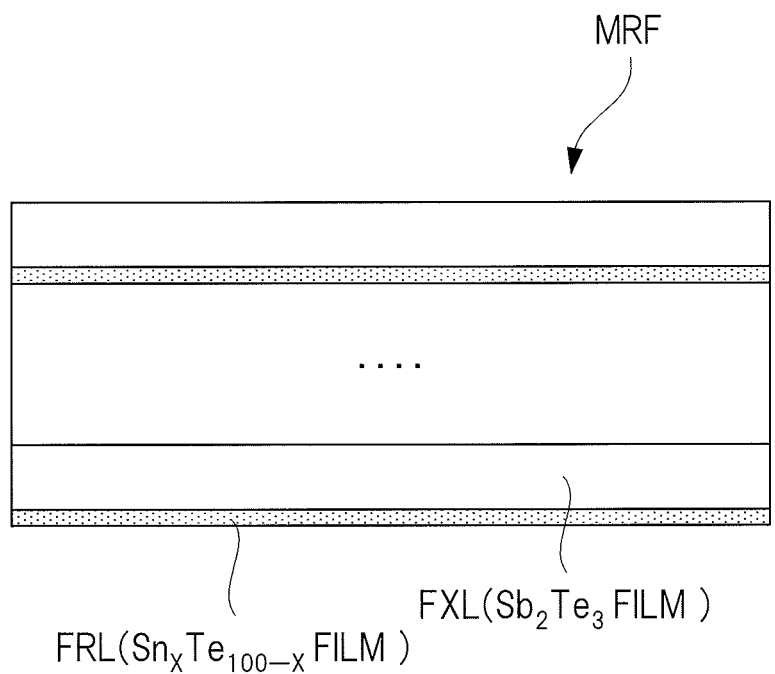
FIG. 2 is a diagram illustrating a method of forming a recording/reproducing film according to the first embodiment.

The recording/reproducing film MRF is formed of a film containing Sn, Sb and Te. More specifically, FIG. 2 is a diagram illustrating a method of forming the recording/reproducing film MRF according to the first embodiment. As illustrated in FIG. 2, the recording/reproducing film MRF is formed by, using a sputtering method, layer-by-layer deposition of a free layer FRL and a pinned layer FXL. That is, the recording/reproducing film MRF is formed in such a manner that a superlattice film (hereinafter, abbreviated as SL film) is formed.

Here, for example, the free layer FRL is formed of a $Sn_xTe_{100-x}$ film and has a thickness of, for example, about 1 nm. Meanwhile, the pinned layer FXL is formed of a $Sb_2Te_3$ film and has a thickness of, for example, about 4 nm. In the present specification, such a superlattice film will be called $Sn_xTe_{100-x}/Sb_2Te_3$ superlattice film (hereinafter, abbreviated as $Sn_xTe_{100-x}/Sb_2Te_3$ SL film). A total film thickness of the $Sn_xTe_{100-x}/Sb_2Te_3$ SL film is, for example, 45 nm. Here, in the first embodiment, X of the $Sn_xTe_{100-x}$ film is represented by 4 at. %≤X≤55 at. %.

While the recording/reproducing film MRF in the first embodiment is formed of such the $Sn_xTe_{100-x}/Sb_2Te_3$ SL film as illustrated in FIG. 2, FIG. 2 schematically illustrates a manufacturing method of the $Sn_xTe_{100-x}/Sb_2Te_3$ SL film and thus the inventors of the present invention have found out that actual structure of the recording/reproducing film MRF is different from the schematic one illustrated in FIG. 2. In other words, the inventors have found out that the $Sn_xTe_{100-x}/Sb_2Te_3$ SL film formed in the method illustrated in FIG. 2 is not in the structure illustrated in FIG. 2 and an actual $Sn_xTe_{100-x}/Sb_2Te_3$ SL film is formed such that it contains a $SnTe/Sb_2Te_3$ superlattice phase formed of SnTe and $Sb_2Te_3$, a SnSbTe alloy phase, and a Te phase, in which the $SnTe/Sb_2Te_3$ superlattice phase is diluted by the SnSbTe alloy phase and the Te phase. That is, the recording/reproducing film MRF according to the first embodiment is formed of the $Sn_xTe_{100-x}/Sb_2Te_3$ SL film containing Sn, Sb, and Te and this SL film has a novel structure as described above.

Hereinafter, regarding typical values of X, the point that the $Sn_xTe_{100-x}/Sb_2Te_3$ SL film has the novel structure described above and the point of the capability of significantly reducing consumed power of a phase-change memory by using the $Sn_xTe_{100-x}/Sb_2Te_3$ film formed like that as the recording/reproducing film MRF will be explained based on experiment data.

EXAMPLE 1

X=35 at. %

Figure 3:
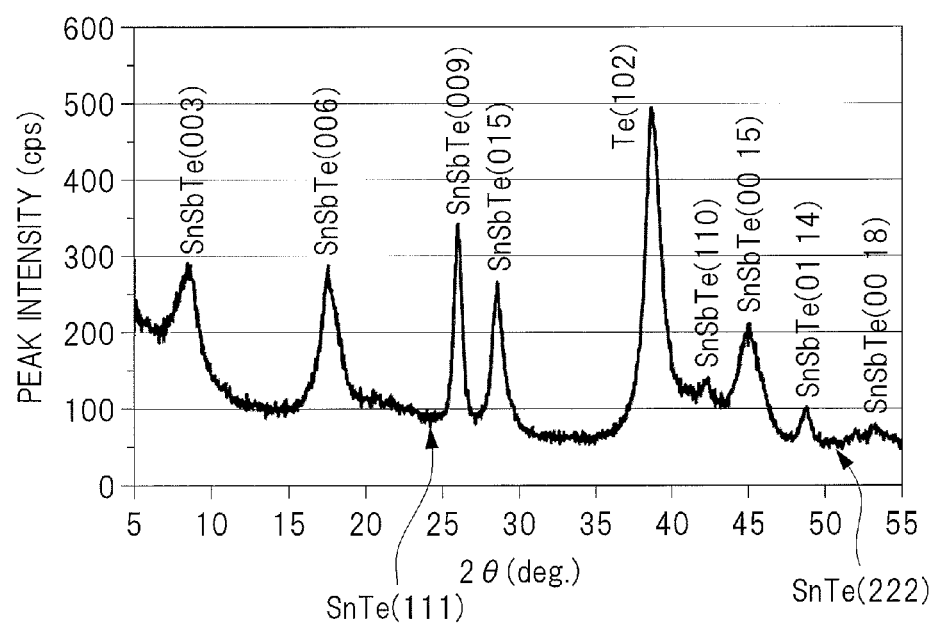
FIG. 3 is a diagram illustrating an XRD (X-ray diffraction) profile of a Sn$_x$Te$_{100-x}$/Sb$_2$Te$_3$ superlattice (hereinafter, abbreviated as SL) film where X=35 at. %.

FIG. 3 is a diagram illustrating an X-ray diffraction (XRD) profile of the $Sn_xTe_{100-x}/Sb_2Te_3$ SL film where X=35 at. %. As illustrated in FIG. 3, from the $Sn_xTe_{100-x}/Sb_2Te_3$ SL film, a plurality of large peaks corresponding to the SnSbTe alloy phase and also a large peak corresponding to the Te phase were observed. Thus, what was found out from FIG. 3 was that the $Sn_xTe_{100-x}/Sb_2Te_3$ SL film has a structure containing the SnSbTe alloy phase having a crystalline structure of hcp hexagonal crystal and the Te phase. Here, although it is not clearly visible, it was confirmed that there is a small peak corresponding to SnTe(111) near $2\theta=24.5°$ and there is a small peak corresponding to SnTe(222) near $2\theta=50.1°$.

Figure 4A:
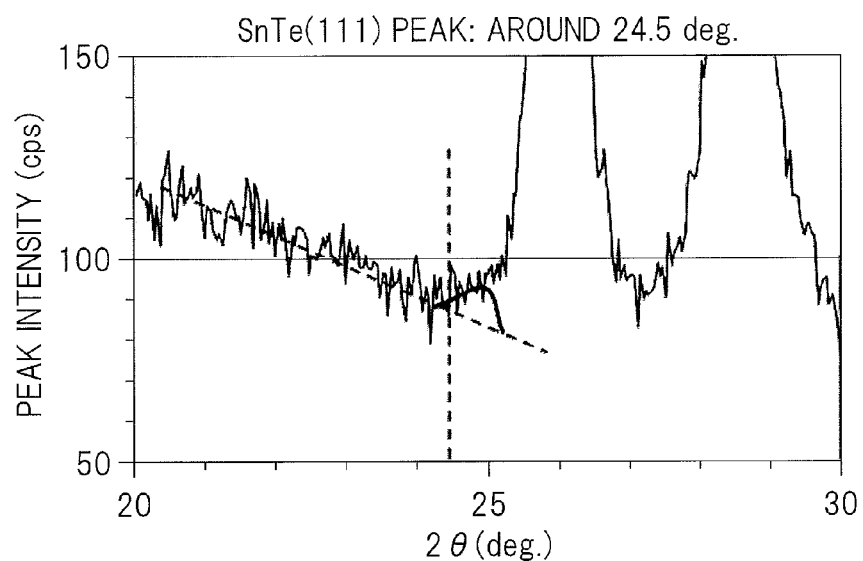
FIG. 4A illustrates an enlarged XRD profile illustrating near 2θ=24.5°.
Figure 4B:
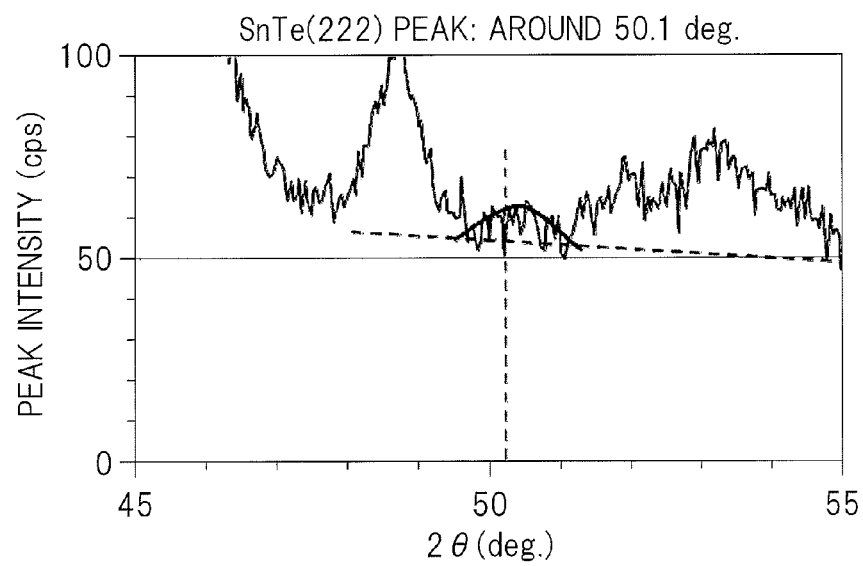
FIG. 4B illustrates an enlarged XRD profile illustrating near 2θ=50.1°.

This point will be explained in more details. FIGS. 4A and 4B are diagrams illustrating enlarged XRD profiles of the $Sn_xTe_{100-x}/Sb_2Te_3$ SL film where X=35 at. %. More specifically, FIG. 4A is an enlarged XRD profile illustrating near $2\theta=24.5°$ and FIG. 4B is an enlarged XRD profile illustrating $2\theta=50.1°$. As illustrated in FIG. 4A, although it is small, there is a peak corresponding to SnTe(111) near $2\theta=24.5°$. In the same manner, as illustrated in FIG. 4B, although it is small, there is a peak corresponding to SnTe(222).

As explained above, since there are a peak corresponding to SnTe(111) and a peak corresponding to SnTe(222) in the $Sn_xTe_{100-x}/Sb_2Te_3$ SL film, it was found out that the $Sn_xTe_{100-x}/Sb_2Te_3$ SL film contains the $SnTe/Sb_2Te_3$ superlattice phase formed of SnTe and $Sb_2Te_3$ (i.e., SnTe(111)/$Sb_2Te_3$(001) phase). Note that, in FIG. 3, although the peak corresponding to $Sb_2Te_3$ is not visible, it is just hidden behind a peak corresponding to the SnSbTe alloy phase.

Thus, from FIG. 3 and FIGS. 4A and 4B, it is indicated that the $Sn_xTe_{100-x}/Sb_2Te_3$ SL film has such a structure that the $SnTe/Sb_2Te_3$ superlattice phase, the SnSbTe alloy phase having a crystalline structure of hcp hexagonal crystal, and the Te phase are present together. In addition, since the peak corresponding to SnTe(111) and the peak corresponding to SnTe(222) are small, it is indicated that a major part of the $Sn_xTe_{100-x}/Sb_2Te_3$ SL film contains the SnSbTe alloy phase having the crystalline structure of hcp hexagonal crystal and the Te phase, and a very small part of the $Sn_xTe_{100-x}/Sb_2Te_3$ SL film contains the $SnTe/Sb_2Te_3$ superlattice phase.

Figure 5:
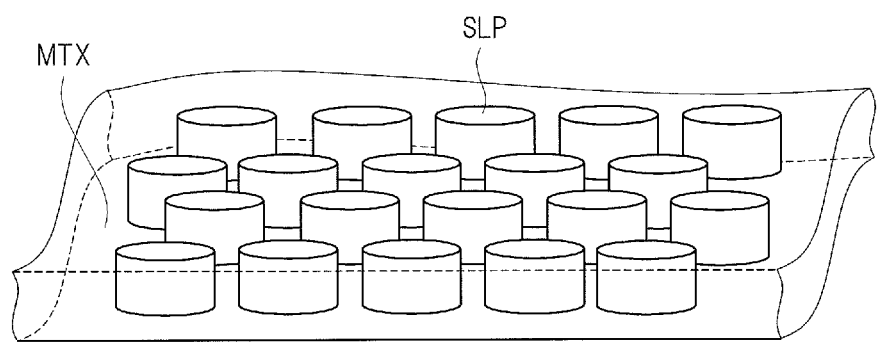
FIG. 5 is a diagram illustrating a schematic structure of the Sn$_x$Te$_{100-x}$/Sb$_2$Te$_3$ SL film indicated from the results of XRD microcrystallographic analysis.

Hereinafter, a schematic structure of the $Sn_xTe_{100-x}/Sb_2Te_3$ SL film indicated from the results of the XRD crystalline structure analysis illustrated in FIGS. 3 to 4B will be explained. FIG. 5 is a diagram illustrating a schematic structure of the $Sn_xTe_{100-x}/Sb_2Te_3$ SL film indicated from the results of XRD crystalline structure analysis illustrated in FIGS. 3 to 4B. As illustrated in FIG. 5, the $SnTe/Sb_2Te_3$ superlattice phase SLP is surrounded by the SnSbTe alloy phase and the Te phase. More specifically, the $Sn_xTe_{100-x}/Sb_2Te_3$ SL film is assumed to have such a structure in which the $SnTe/Sb_2Te_3$ superlattice phase SLP is spread in a matrix MTX formed of the SnSbTe alloy phase and the Te phase. Here, the matrix MTX can be considered to be formed mainly of the SnSbTe alloy phase.

Note that, FIG. 5 is illustrated in such a manner that the amount of the $SnTe/Sb_2Te_3$ superlattice phase is overdrawn for facilitate understanding of the structure of the $Sn_xTe_{100-x}/Sb_2Te_3$ SL film. Occupied area and volume of the $SnTe/Sb_2Te_3$ superlattice phase are little. The same goes to second to fourth examples described below.

In the manner described in the foregoing, the $Sn_xTe_{100-x}/Sb_2Te_3$ SL film forming the recording/reproducing film MRF according to the first example has a structure in which the $SnTe/Sb_2Te_3$ superlattice phase and the SnSbTe alloy phase having the crystalline structure of hcp crystal, and the Te phase are present together, and also the $SnTe/Sb_2Te_3$ superlattice phase is spread in the matrix formed of the SnSbTe alloy phase and the Te phase. In other words, it can be considered such that, in the $Sn_xTe_{100-x}/Sb_2Te_3$ SL film forming the recording/reproducing film MRF according to the first example, the $SnTe/Sb_2Te_3$ superlattice phase is diluted by the SnSbTe alloy phase and the Te phase.

Subsequently, the point of the capability of significantly reducing consumed power of a phase-change memory by using the $Sn_xTe_{100-x}/Sb_2Te_3$ SL film having the novel structure as described above as the recording/reproducing film MRF will be explained.

Figure 6A:
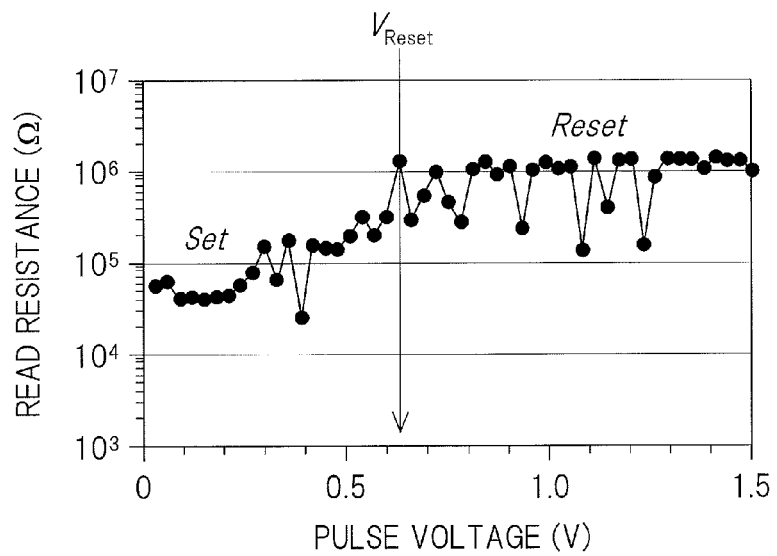
FIG. 6A is a diagram of an experiment result illustrating a pulse-voltage dependency of a read resistance of the phase-change memory according to a first example.
Figure 6B:
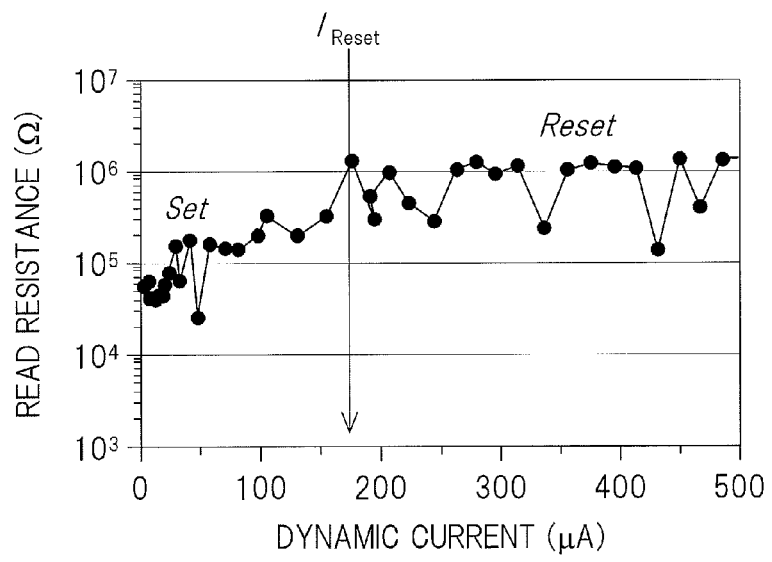
FIG. 6B is a diagram of an experiment result illustrating a dynamic-current dependency of a read resistance of the phase-change memory according to the first example.

FIG. 6A illustrates an experimental result illustrating dependency of a read resistance to pulse voltage (applied voltage) in the phase-change memory according to the first example. FIG. 6B illustrates an experimental result illustrating dependency of the read resistance to dynamic current in the phase-change memory according to the first example. The reset voltage ($V_{Reset}$) is about 0.65 V as illustrated in FIG. 6A, and the reset current ($I_{Reset}$) is about 175 µA as illustrated in FIG. 6B. Thus, the switching power obtained by a multiple of the reset voltage and the reset current is about 114 µW. This value is about one-fiftieth (1/50) of the switching power (=about 6080 µW) of the existing phase-change memory called GST225 that was manufactured and measured in the same manner. Thus, by the phase-change memory according to the first example, consumed power can be reduced to about 1/50 as compared with already existing phase-change memories. That is, by using the phase-change memory according to the first example to a memory cell of a semiconductor recording/reproducing device, a semiconductor recording/reproducing device having consumed power that is reduced to about 1/50 can be provided.

SECOND EXAMPLE

X=20 at. %

Figure 7:
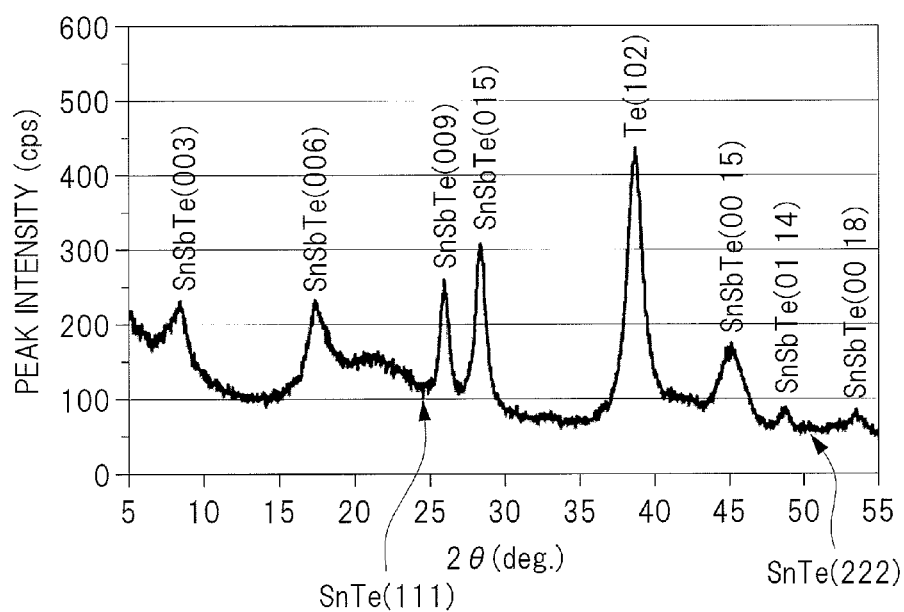
FIG. 7 is a diagram illustrating an XRD profile of the Sn$_x$Te$_{100-x}$/Sb$_2$Te$_3$ SL film where X=20 at. %.

FIG. 7 is a diagram illustrating an XRD profile of the $Sn_xTe_{100-x}/Sb_2Te_3$ SL film where X=20 at. %. As illustrated in FIG. 7, from the $Sn_xTe_{100-x}/Sb_2Te_3$ SL film, a plurality of large peaks corresponding to the SnSbTe alloy phase are observed and also a large peak corresponding to the Te phase is observed. Thus, it is understood that the $Sn_xTe_{100-x}/Sb_2Te_3$ SL film has a structure containing at least the SnSbTe alloy phase having the crystalline structure of hcp hexagonal crystal and the Te phase. Here, although it is not clearly visible in FIG. 7, it was confirmed that there is a small peak corresponding to SnTe(111) near $2\theta=24.5°$ and there is a small peak corresponding to SnTe(222) near $2\theta=50.1°$.

Figure 8A:
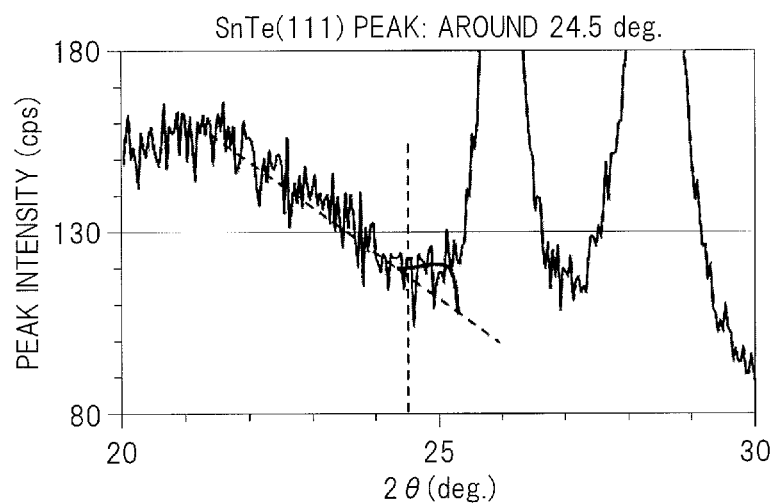
FIG. 8A illustrates an enlarged XRD profile near 2θ=24.5°.
Figure 8B:
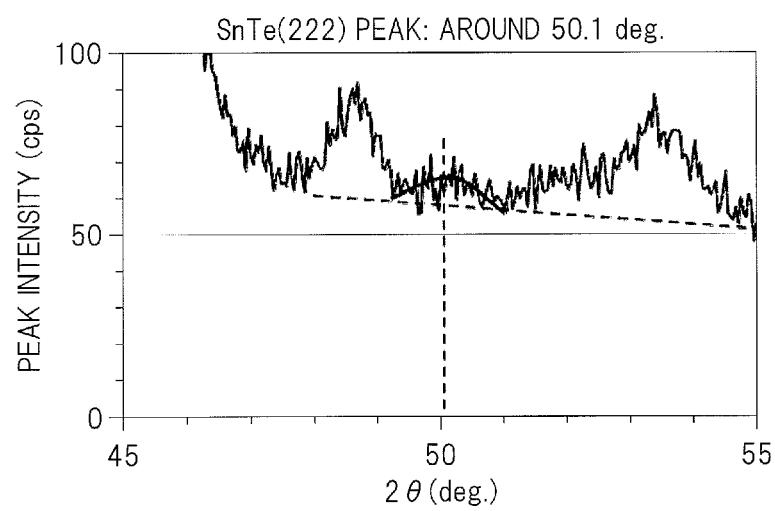
FIG. 8B illustrates an enlarged XRD profile near 2θ=50.1°.

This point will be explained in more details. FIGS. 8A and 8B are diagrams illustrating enlarged XRD profiles of the $Sn_xTe_{100-x}/Sb_2Te_3$ SL film where X=20 at. %. More specifically, FIG. 8A is an enlarged XRD profile illustrating near $2\theta=24.5°$ and FIG. 8B is an enlarged XRD profile illustrating $2\theta=50.1°$. As illustrated in FIG. 8A, although it is small, there is a peak corresponding to SnTe(111) near $2\theta=24.5°$. In the same manner, as illustrated in FIG. 8B, although it is small, there is a peak corresponding to SnTe(222).

As explained above, since there are a peak corresponding to SnTe(111) and a peak corresponding to SnTe(222) in the $Sn_xTe_{100-x}/Sb_2Te_3$ SL film, it was found out that the $Sn_xTe_{100-x}/Sb_2Te_3$ SL film contains the $SnTe/Sb_2Te_3$ superlattice phase formed of SnTe and $Sb_2Te_3$ (i.e., SnTe(111)/$Sb_2Te_3$(001) phase). Note that, in FIG. 7, although the peak corresponding to $Sb_2Te_3$ is not visible, it is just hidden behind a peak corresponding to the SnSbTe alloy phase.

Thus, from FIG. 7 and FIGS. 8A and 8B, it is indicated that the $Sn_xTe_{100-x}/Sb_2Te_3$ SL film has such a structure that the $SnTe/Sb_2Te_3$ superlattice phase, the SnSbTe alloy phase having a crystalline structure of hcp hexagonal crystal, and the Te phase are present together. In addition, since the peak corresponding to SnTe(111) and the peak corresponding to SnTe(222) are small, it is indicated that a major part of the $Sn_xTe_{100-x}/Sb_2Te_3$ SL film contains the SnSbTe alloy phase having the crystalline structure of hcp hexagonal crystal and the Te phase, and a very small part of the $Sn_xTe_{100-x}/Sb_2Te_3$ SL film contains the $SnTe/Sb_2Te_3$ superlattice phase.

Figure 9:
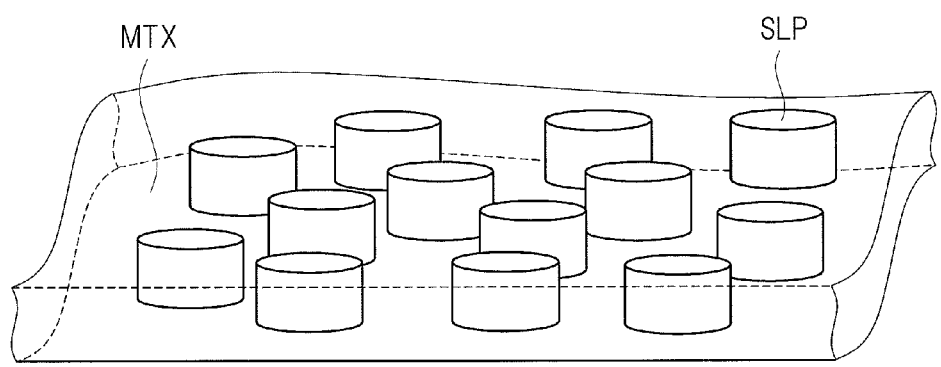
FIG. 9 is a diagram illustrating a schematic structure of the Sn$_x$Te$_{100-x}$/Sb$_2$Te$_3$ SL film indicated from the results of XRD microcrystallographic analysis.

Hereinafter, a schematic structure of the $Sn_xTe_{100-x}/Sb_2Te_3$ SL film indicated from the results of the XRD crystalline structure analysis illustrated in FIGS. 7 to 8B will be explained. FIG. 9 is a diagram illustrating a schematic structure of the $Sn_xTe_{100-x}/Sb_2Te_3$ SL film indicated from the results of XRD crystalline structure analysis illustrated in FIGS. 7 to 8B. As illustrated in FIG. 9, also in the second example corresponding to the condition X=20 at. %, in the same manner as the first example corresponding to the condition X=35 at. %, the $SnTe/Sb_2Te_3$ superlattice phase SLP is surrounded by the SnSbTe alloy phase and the Te phase. More specifically, the $Sn_xTe_{100-x}/Sb_2Te_3$ SL film is assumed to have such a structure in which the $SnTe/Sb_2Te_3$ superlattice phase SLP is spread in a matrix MTX formed of the SnSbTe alloy phase and the Te phase. Here, the matrix MTX can be considered to be formed mainly of the SnSbTe alloy phase.

Here, in the second example, since the composition ratio of X is smaller as compared with that of the first example, the amount of the $SnTe/Sb_2Te_3$ superlattice phase SLP spread in the matrix MTX is small.

In the manner described in the foregoing, the $Sn_xTe_{100-x}/Sb_2Te_3$ SL film forming the recording/reproducing film MRF according to the second example has a structure in which the $SnTe/Sb_2Te_3$ superlattice phase and the SnSbTe alloy phase having the crystalline structure of hcp crystal, and the Te phase are present together, and also the $SnTe/Sb_2Te_3$ superlattice phase is spread in the matrix formed of the SnSbTe alloy phase and the Te phase. In other words, it can be considered such that, in the $Sn_xTe_{100-x}/Sb_2Te_3$ SL film forming the recording/reproducing film MRF according to the second example, the $SnTe/Sb_2Te_3$ superlattice phase is diluted by the SnSbTe alloy phase and the Te phase.

Subsequently, the point of the capability of significantly reducing consumed power of a phase-change memory by using the $Sn_xTe_{100-x}/Sb_2Te_3$ SL film having the novel structure as described above as the recording/reproducing film MRF will be explained.

Figure 10A:
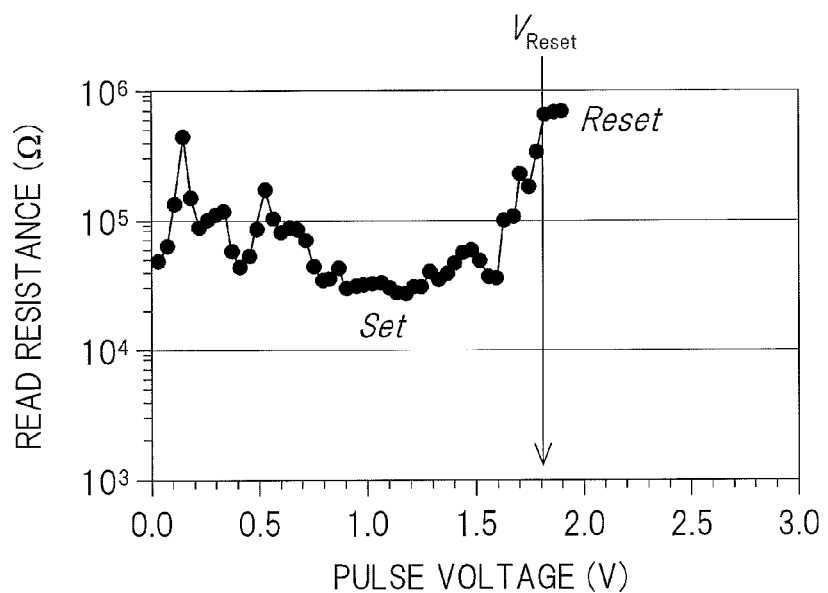
FIG. 10A is a diagram of an experiment result illustrating a pulse-voltage dependency of a read resistance of the phase-change memory according to a second example.
Figure 10B:
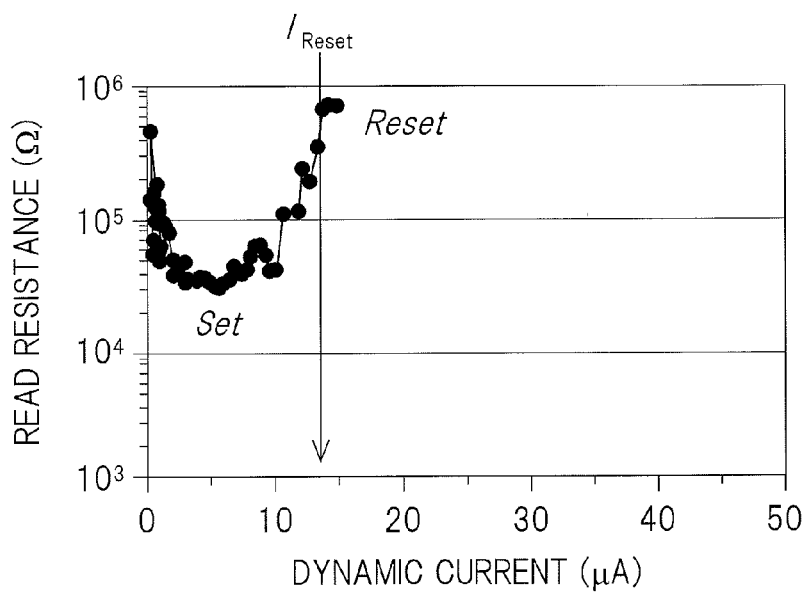
FIG. 10B is a diagram of an experiment result illustrating a dynamic-current dependency of a read resistance of the phase-change memory according to the second example.

FIG. 10A illustrates an experimental result illustrating dependency of a read resistance to pulse voltage (applied voltage) in the phase-change memory according to the second example. FIG. 10B illustrates an experimental result illustrating dependency of the read resistance to dynamic current in the phase-change memory according to the second example. The reset voltage ($V_{Reset}$) is about 1.81 V as illustrated in FIG. 10A, and the reset current ($I_{Reset}$) is about 13.5 µA as illustrated in FIG. 10B. Thus, the switching power obtained by a multiple of the reset voltage and the reset current is about 24 µW. This value is about one-two-hundred-fiftieth (1/250) of the switching power (=about 6080 µW) of the existing phase-change memory called GST225 that was manufactured and measured in the same manner. Thus, by the phase-change memory according to the second example, consumed power can be reduced to about 1/250 as compared with already existing phase-change memories. That is, by using the phase-change memory according to the second example to a memory cell of a semiconductor recording/reproducing device, a semiconductor recording/reproducing device having consumed power that is reduced to about 1/250 can be provided.

THIRD EXAMPLE

X=10 at. %

Figure 11:
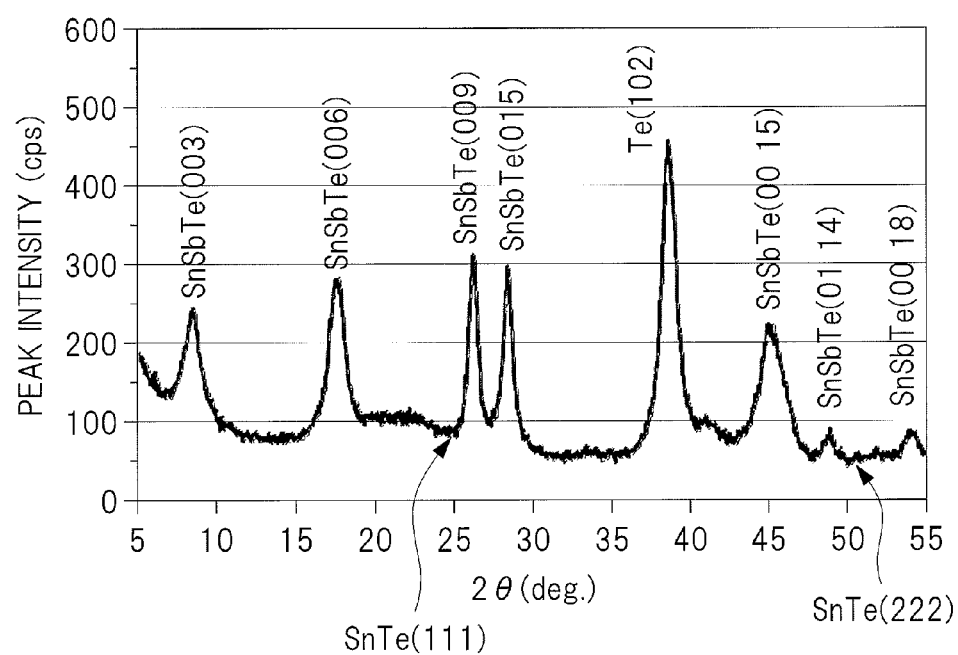
FIG. 11 is a diagram illustrating an XRD (X-ray diffraction) profile of a Sn$_x$Te$_{100-x}$/Sb$_2$Te$_3$ SL film where X=10 at. %.

FIG. 11 is a diagram illustrating an XRD profile of the $Sn_xTe_{100-x}/Sb_2Te_3$ SL film where X=10 at. %. As illustrated in FIG. 11, from the $Sn_xTe_{100-x}/Sb_2Te_3$ SL film, a plurality of large peaks corresponding to the SnSbTe alloy phase are observed and also a large peak corresponding to the Te phase is observed. Thus, it is understood that the $Sn_xTe_{100-x}/Sb_2Te_3$ SL film has a structure containing at least the SnSbTe alloy phase having the crystalline structure of hcp hexagonal crystal and the Te phase. Here, although it is not clearly visible in FIG. 11, it was confirmed that there is a small peak corresponding to SnTe(111) near 2θ=24.5° and there is a small peak corresponding to SnTe(222) near 2θ=50.1°.

Figure 12A:
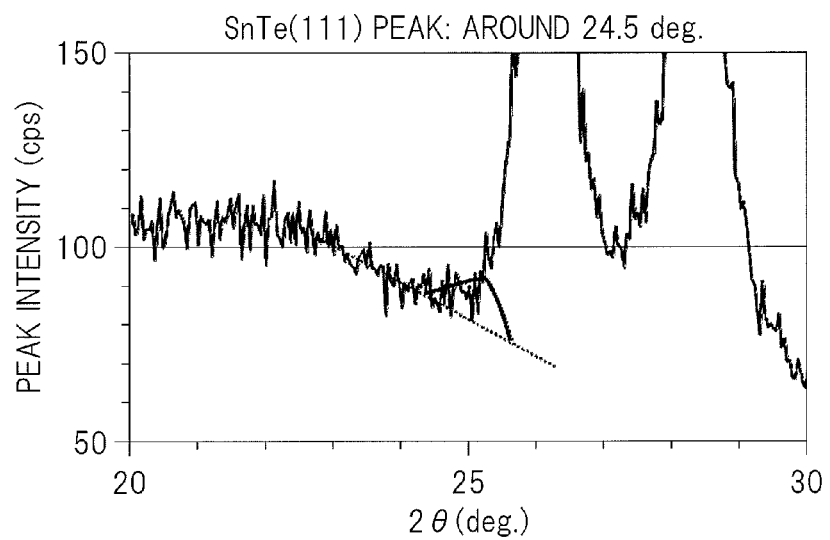
FIG. 12A illustrates an enlarged XRD profile illustrating near 2θ=24.5°.
Figure 12B:
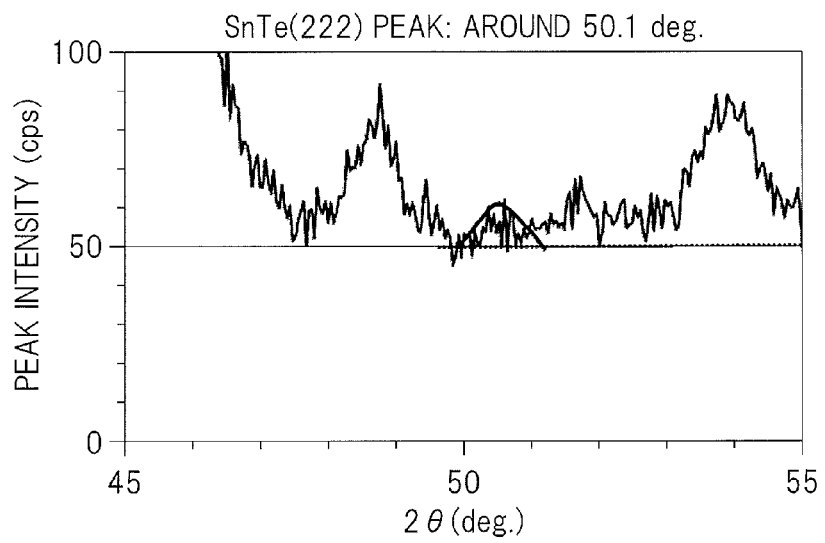
FIG. 12B illustrates an enlarged XRD profile illustrating near 2θ=50.1°.

This point will be explained in more details. FIGS. 12A and 12B are diagrams illustrating enlarged XRD profiles of the $Sn_xTe_{100-x}/Sb_2Te_3$ SL film where X=20 at. %. More specifically, FIG. 12A is an enlarged XRD profile illustrating near 2θ=24.5° and FIG. 12B is an enlarged XRD profile illustrating 2θ=50.1°. As illustrated in FIG. 12A, although it is small, there is a peak corresponding to SnTe(111) near 2θ=24.5°. In the same manner, as illustrated in FIG. 12B, although it is small, there is a peak corresponding to SnTe(222).

As explained above, since there are a peak corresponding to SnTe(111) and a peak corresponding to SnTe(222) in the $Sn_xTe_{100-x}/Sb_2Te_3$ SL film, it was found out that the $Sn_xTe_{100-x}/Sb_2Te_3$ SL film contains the $SnTe/Sb_2Te_3$ superlattice phase formed of SnTe and $Sb_2Te_3$ (i.e., SnTe(111)/$Sb_2Te_3$(001) phase). Note that, in FIG. 11, although the peak corresponding to $Sb_2Te_3$ is not visible, it is just hidden behind a peak corresponding to the SnSbTe alloy phase.

Thus, from FIG. 11 and FIGS. 12A and 12B, it is indicated that the $Sn_xTe_{100-x}/Sb_2Te_3$ SL film has such a structure that the $SnTe/Sb_2Te_3$ superlattice phase, the SnSbTe alloy phase having a crystalline structure of hcp hexagonal crystal, and the Te phase are present together. In addition, since the peak corresponding to SnTe(111) and the peak corresponding to SnTe(222) are small, it is indicated that a major part of the $Sn_xTe_{100-x}/Sb_2Te_3$ SL film in the SnSbTe alloy phase having the crystalline structure of hcp hexagonal crystal and the Te phase, and a very small part of the $Sn_xTe_{100-x}/Sb_2Te_3$ SL film contains the $SnTe/Sb_2Te_3$ superlattice phase.

Figure 13:
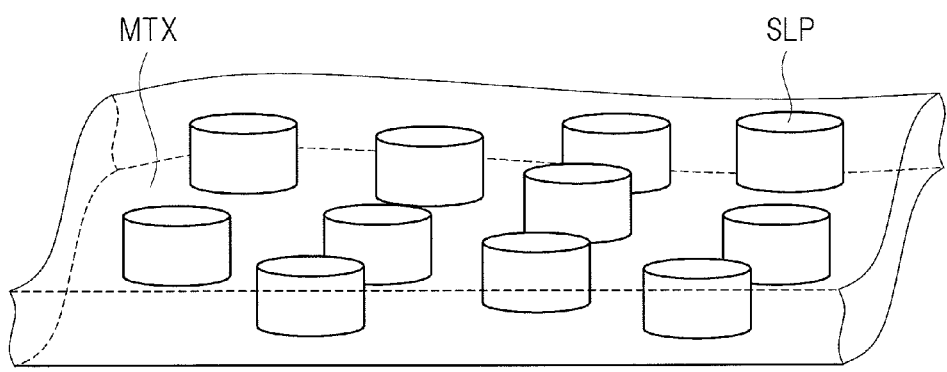
FIG. 13 is a diagram illustrating a schematic structure of the Sn$_x$Te$_{100-x}$/Sb$_2$Te$_3$ SL film indicated from the results of XRD microcrystallographic analysis.

Hereinafter, a schematic structure of the $Sn_xTe_{100-x}/Sb_2Te_3$ SL film indicated from the results of the XRD crystalline structure analysis illustrated in FIGS. 11 to 12B will be explained. FIG. 13 is a diagram illustrating a schematic structure of the $Sn_xTe_{100-x}/Sb_2Te_3$ SL film indicated from the results of XRD crystalline structure analysis illustrated in FIGS. 11 to 12B. As illustrated in FIG. 13, also in the third example corresponding to the condition X=10 at. %, in the same manner as the first example corresponding to the condition X=35 at. % and the second example corresponding to the condition X=20 at. %, the $SnTe/Sb_2Te_3$ superlattice phase SLP is surrounded by the SnSbTe alloy phase and the Te phase. More specifically, the $Sn_xTe_{100-x}/Sb_2Te_3$ SL film is assumed to have such a structure in which the $SnTe/Sb_2Te_3$ superlattice phase SLP is spread in a matrix MTX formed of the SnSbTe alloy phase and the Te phase. Here, the matrix MTX can be considered to be formed mainly of the SnSbTe alloy phase.

Here, in the third example, since the composition ratio of X is smaller as compared with that of the first and second examples, the amount of the $SnTe/Sb_2Te_3$ superlattice phase SLP spread in the matrix MTX is small.

In the manner described in the foregoing, the $Sn_xTe_{100-x}/Sb_2Te_3$ SL film forming the recording/reproducing film MRF according to the third example has a structure in which the $SnTe/Sb_2Te_3$ superlattice phase and the SnSbTe alloy phase having the crystalline structure of hcp crystal, and the Te phase are present together, and also the $SnTe/Sb_2Te_3$ superlattice phase is spread in the matrix formed of the SnSbTe alloy phase and the Te phase. In other words, it can be considered such that, in the $Sn_xTe_{100-x}/Sb_2Te_3$ SL film forming the recording/reproducing film MRF according to the third example, the $SnTe/Sb_2Te_3$ superlattice phase is diluted by the SnSbTe alloy phase and the Te phase.

Subsequently, the point of the capability of significantly reducing consumed power of a phase-change memory by using the $Sn_xTe_{100-x}/Sb_2Te_3$ SL film having the novel structure as described above as the recording/reproducing film MRF will be explained.

Figure 14A:
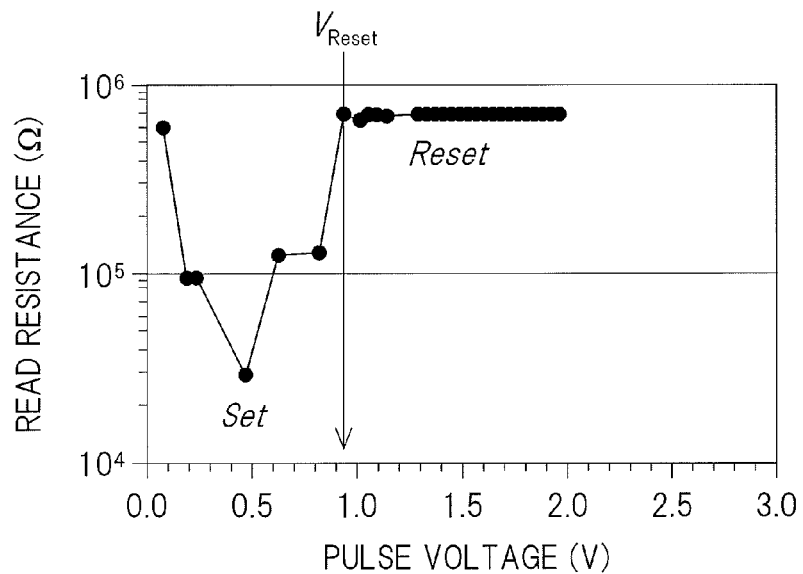
FIG. 14A is a diagram of an experiment result illustrating a pulse-voltage dependency of a read resistance of the phase-change memory according to a third example.
Figure 14B:
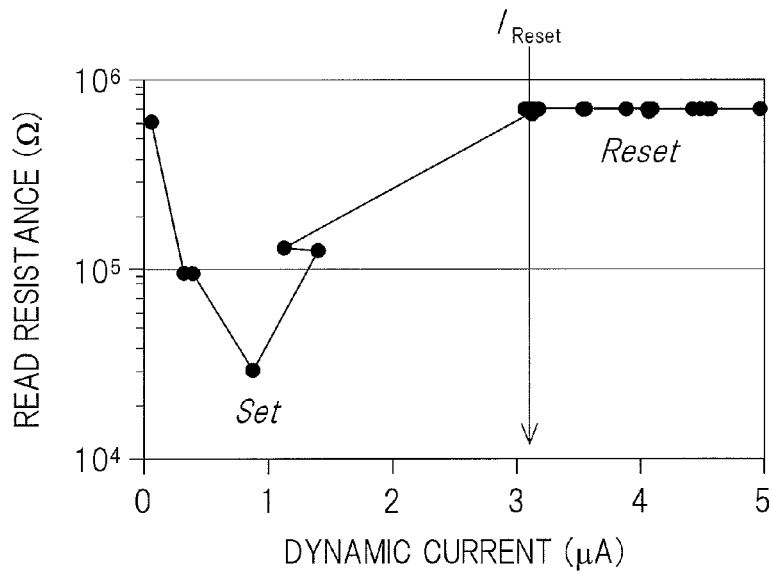
FIG. 14B is a diagram of an experiment result illustrating a dynamic-current dependency of a read resistance of the phase-change memory according to the third example.

FIG. 14A illustrates an experimental result illustrating dependency of a read resistance to pulse voltage (applied voltage) in the phase-change memory according to the third example. FIG. 14B illustrates an experimental result illustrating dependency of the read resistance to dynamic current in the phase-change memory according to the third example. The reset voltage ($V_{Reset}$) is about 0.92 V as illustrated in FIG. 14A, and the reset current ($I_{Reset}$) is about 3.2 μA as illustrated in FIG. 14B. Thus, the switching power obtained by a multiple of the reset voltage and the reset current is about 2.9 μW. This value is about one-two-thousand-hundredth (1/2100) of the switching power (=about 6080 μW) of the existing phase-change memory called GST225 that was manufactured and measured in the same manner. Thus, by the phase-change memory according to the third example, consumed power can be reduced to about 1/2100 as compared with already existing phase-change memories. That is, by using the phase-change memory according to the third example to a memory cell of a semiconductor recording/reproducing device, a semiconductor recording/reproducing device having consumed power that is reduced to about 1/2100 can be provided.

FOURTH EXAMPLE

X=5 at. %

Figure 15:
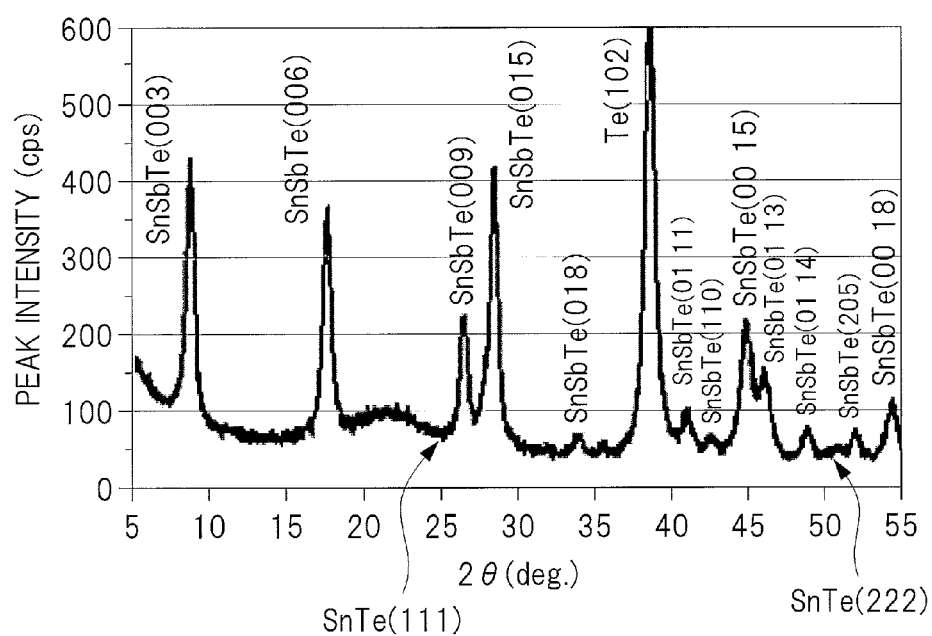
FIG. 15 is a diagram illustrating an XRD (X-ray diffraction) profile of a Sn$_x$Te$_{100-x}$/Sb$_2$Te$_3$ SL film where X=5 at. %.

FIG. 15 is a diagram illustrating an XRD profile of the $Sn_xTe_{100-x}/Sb_2Te_3$ SL film where X=5 at. %. As illustrated in FIG. 15, from the $Sn_xTe_{100-x}/Sb_2Te_3$ SL film, a plurality of large peaks corresponding to the SnSbTe alloy phase are observed and also a large peak corresponding to the Te phase is observed. Thus, it is understood that the $Sn_xTe_{100-x}/Sb_2Te_3$SL film has a structure containing at least the SnSbTe alloy phase having the crystalline structure of hcp hexagonal crystal and the Te phase. Here, although it is not clearly visible in FIG. 15, it was confirmed that there is a small peak corresponding to SnTe(111) near 2θ=24.5° and there is a small peak corresponding to SnTe(222) near 2θ=50.1°.

Figure 16A:
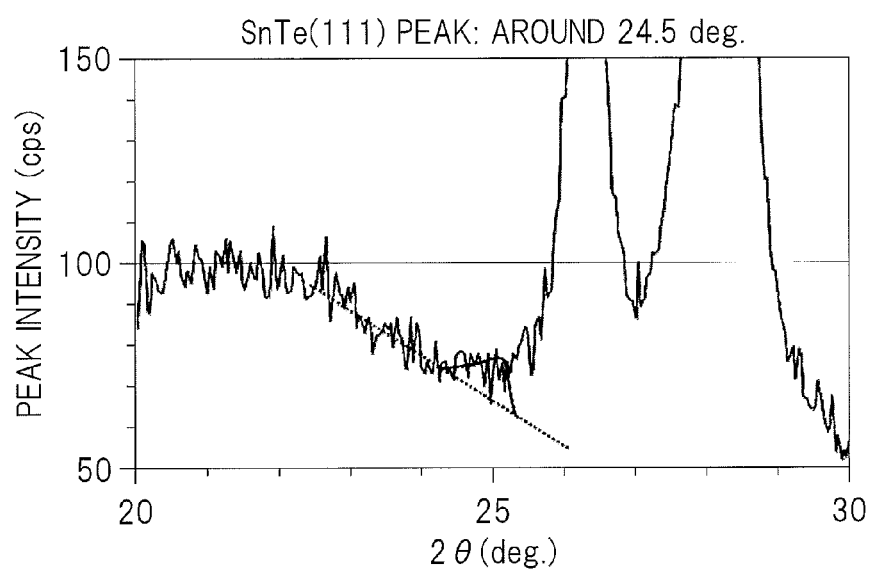
FIG. 16A illustrates an enlarged XRD profile illustrating near 2θ=24.5°.
Figure 16B:
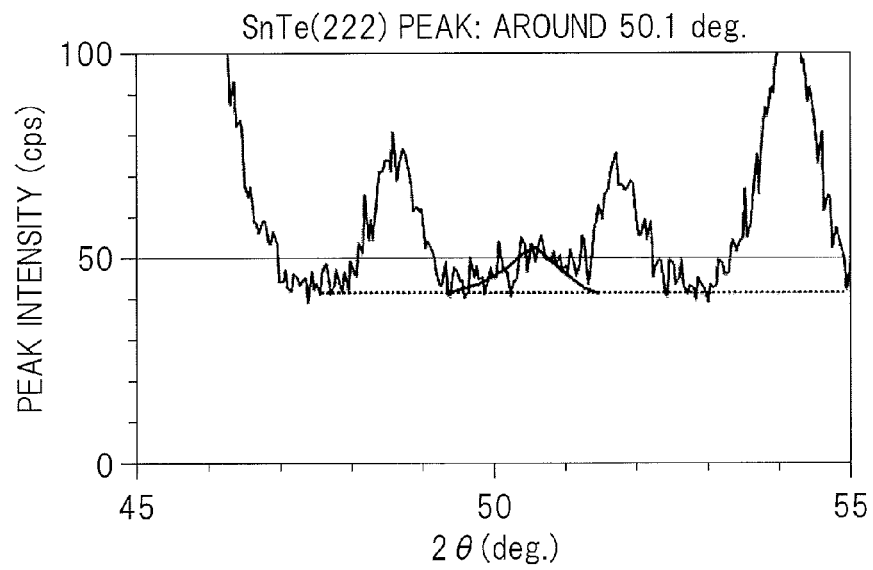
FIG. 16B illustrates an enlarged XRD profile illustrating near 2θ=50.1°.

This point will be explained in more details. FIGS. 16A and 16B are diagrams illustrating enlarged XRD profiles of the $Sn_xTe_{100-x}/Sb_2Te_3$SL film where X=5 at. %. More specifically, FIG. 16A is an enlarged XRD profile illustrating near 2θ=24.5° and FIG. 16B is an enlarged XRD profile illustrating 2θ=50.1°. As illustrated in FIG. 16A, although it is small, there is a peak corresponding to SnTe(111) near 2θ=24.5°. In the same manner, as illustrated in FIG. 16B, although it is small, there is a peak corresponding to SnTe(222).

As explained above, since there are a peak corresponding to SnTe(111) and a peak corresponding to SnTe(222) in the $Sn_xTe_{100-x}/Sb_2Te_3$SL film, it was found out that the $Sn_xTe_{100-x}/Sb_2Te_3$SL film contains the SnTe/$Sb_2Te_3$ superlattice phase formed of SnTe and $Sb_2Te_3$ (i.e., SnTe(111)/$Sb_2Te_3$(001) phase). Note that, in FIG. 15, although the peak corresponding to $Sb_2Te_3$ is not visible, it is just hidden behind a peak corresponding to the SnSbTe alloy phase.

Thus, from FIG. 15 and FIGS. 16A and 16B, it is indicated that the $Sn_xTe_{100-x}/Sb_2Te_3$SL film has such a structure that the SnTe/$Sb_2Te_3$ superlattice phase, the SnSbTe alloy phase having a crystalline structure of hcp hexagonal crystal, and the Te phase are present together. In addition, since the peak corresponding to SnTe(111) and the peak corresponding to SnTe (222) are small, it is indicated that a major part of the $Sn_xTe_{100-x}/Sb_2Te_3$ SL film contains the SnSbTe alloy phase having the crystalline structure of hcp hexagonal crystal and the Te phase, and a very small part of the $Sn_xTe_{100-x}/Sb_2Te_3$ SL film contains the SnTe/$Sb_2Te_3$ superlattice phase.

Figure 17:
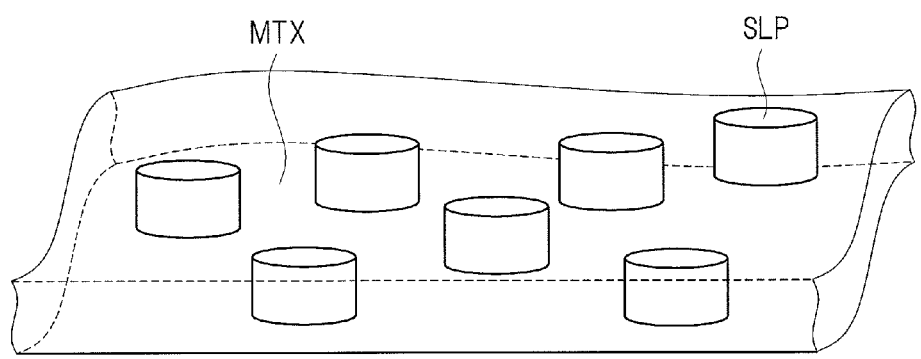
FIG. 17 is a diagram illustrating a schematic structure of the Sn$_x$Te$_{100-x}$/Sb$_2$Te$_3$ SL film indicated from the results of XRD microcrystallographic analysis.

Hereinafter, a schematic structure of the $Sn_xTe_{100-x}/Sb_2Te_3$ SL film indicated from the results of the XRD crystalline structure analysis illustrated in FIGS. 15 to 16B will be explained. FIG. 17 is a diagram illustrating a schematic structure of the $Sn_xTe_{100-x}/Sb_2Te_3$ SL film indicated from the results of XRD crystalline structure analysis illustrated in FIGS. 15 to 16B. As illustrated in FIG. 17, also in the fourth example corresponding to the condition X=5 at. %, in the same manner as the first example corresponding to the condition X=35 at. %, the second example corresponding to the condition X=20 at. %, and the third example corresponding to the condition X=10 at. %, the SnTe/$Sb_2Te_3$ superlattice phase SLP is surrounded by the SnSbTe alloy phase and the Te phase. More specifically, the $Sn_xTe_{100-x}/Sb_2Te_3$ SL film is assumed to have such a structure in which the SnTe/$Sb_2Te_3$ superlattice phase SLP is spread in a matrix MTX formed of the SnSbTe alloy phase and the Te phase. Here, the matrix MTX can be considered to be formed mainly of the SnSbTe alloy phase.

Here, in the fourth example, since the composition ratio of X is smaller as compared with that of the first, second, and third examples, the amount of the SnTe/$Sb_2Te_3$ superlattice phase SLP spread in the matrix MTX is small.

In the manner described in the foregoing, the $Sn_xTe_{100-x}/Sb_2Te_3$ SL film forming the recording/reproducing film MRF according to the fourth example has a structure in which the SnTe/$Sb_2Te_3$ superlattice phase and the SnSbTe alloy phase having the crystalline structure of hcp crystal, and the Te phase are present together, and also the SnTe/$Sb_2Te_3$ superlattice phase is spread in the matrix formed of the SnSbTe alloy phase and the Te phase. In other words, it can be considered such that, in the $Sn_xTe_{100-x}/Sb_2Te_3$ SL film forming the recording/reproducing film MRF according to the fourth example, the SnTe/$Sb_2Te_3$ superlattice phase is diluted by the SnSbTe alloy phase and the Te phase.

Subsequently, the point of the capability of significantly reducing consumed power of a phase-change memory by using the $Sn_xTe_{100-x}/Sb_2Te_3$SL film having the novel structure as described above as the recording/reproducing film MRF will be explained.

Figure 18A:
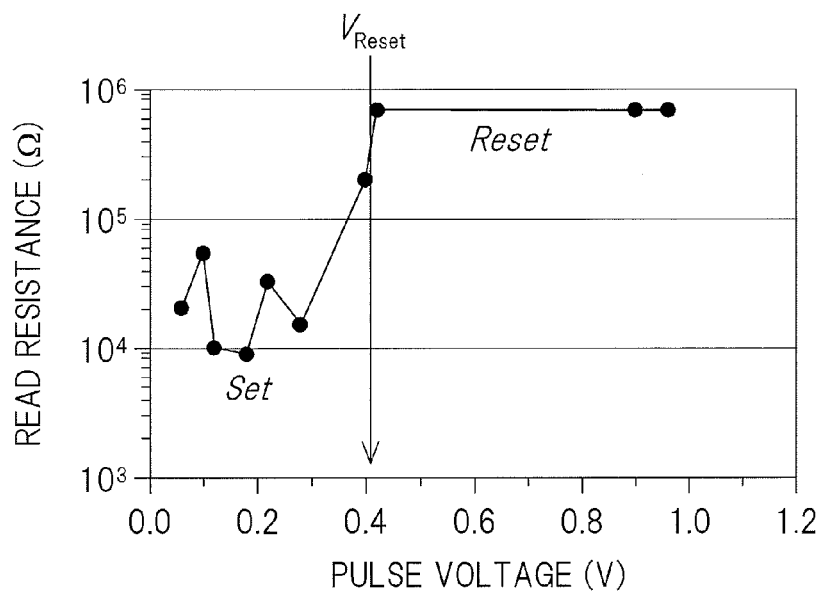
FIG. 18A is a diagram of an experiment result illustrating a pulse-voltage dependency of a read resistance of the phase-change memory according to a fourth example.
Figure 18B:
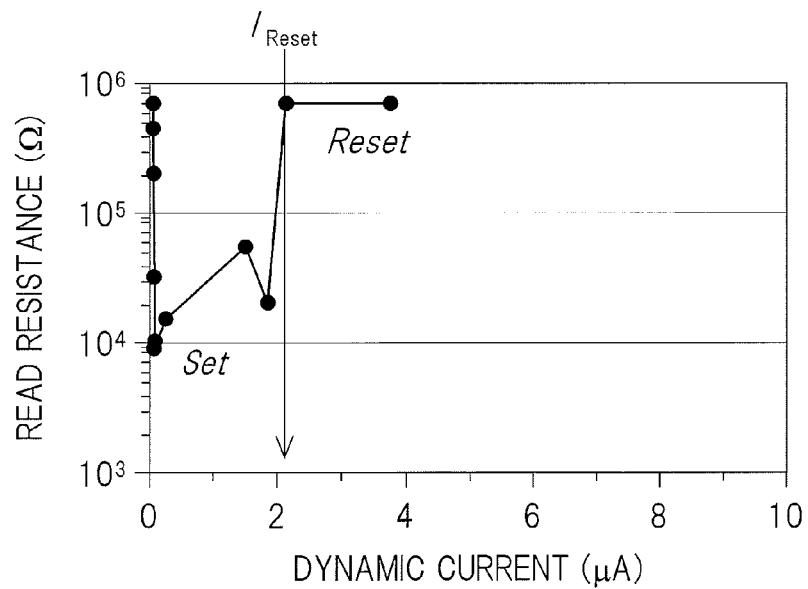
FIG. 18B is a diagram of an experiment result illustrating a dynamic-current dependency of a read resistance of the phase-change memory according to the fourth example.

FIG. 18A illustrates an experimental result illustrating dependency of a read resistance to pulse voltage (applied voltage) in the phase-change memory according to the fourth example. FIG. 18B illustrates an experimental result illustrating dependency of the read resistance to dynamic current in the phase-change memory according to the fourth example. The reset voltage ($V_{Reset}$) is about 0.41 V as illustrated in FIG. 18A, and the reset current ($I_{Reset}$) is about 2.1 μA as illustrated in FIG. 18B. Thus, the switching power obtained by a multiple of the reset voltage and the reset current is about 0.86 μW. This value is about one-seven-thousand-seventieth (1/7070) of the switching power (=about 6080 μW) of the existing phase-change memory called GST225 that was manufactured and measured in the same manner. Thus, by the phase-change memory according to the fourth example, consumed power can be reduced to about 1/7070 as compared with already existing phase-change memories. That is, by using the phase-change memory according to the fourth example to a memory cell of a semiconductor recording/reproducing device, a semiconductor recording/reproducing device having consumed power that is reduced to about 1/7070 can be provided.

As described in the first to fourth examples above, by setting the value X of the $Sn_xTe_{100-x}/Sb_2Te_3$ SL film as X=5 at. %, 10 at. %, 20 at. %, and 35 at. %, consumed power of a phase-change memory can be reduced to about 1/50 to about 1/7070. That is, by using the phase-change memories according to the first to fourth example, a semiconductor recording/reproducing device consumed power of which is reduced to about 1/50 to about 1/7070 can be provided.

Here, given the first to fourth examples, it is indicated that consumed power of a phase-change memory can be monotonically reduced by decreasing the value of X. From this point, given the first to fourth examples, it can be considered that also in the range of 5 at. %≤X≤35 at. %, consumed power of a phase-change memory can be reduced to about 1/50 to about 1/7070.

a. (Second Embodiment)

In a second embodiment, a semiconductor device using the phase-change memory according to the first embodiment will be described.

a. <Configuration of Memory Cell>

Figure 19:
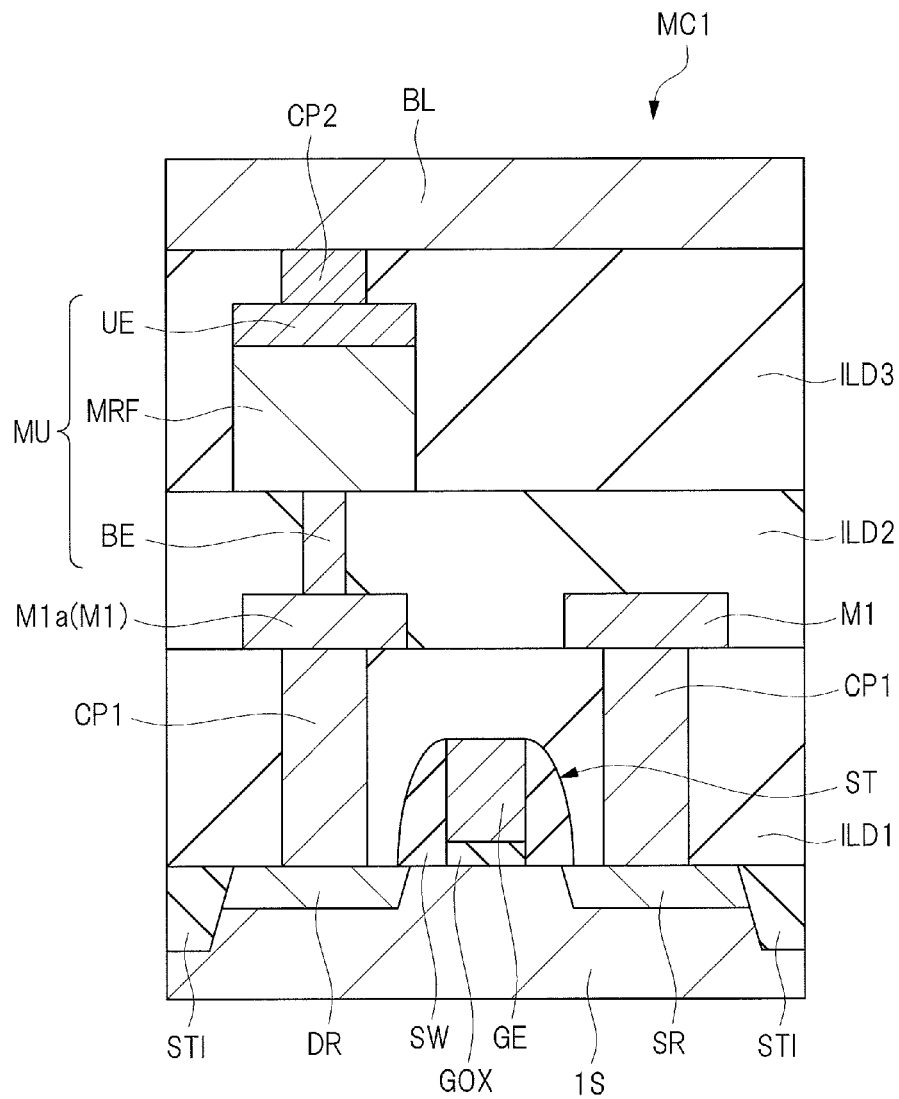
FIG. 19 is a cross-sectional view illustrating a configuration of memory cells of a semiconductor recording/reproducing device according to a second embodiment.

FIG. 19 is a cross-sectional view illustrating a configuration of a memory cell of the semiconductor recording/reproducing device according to the second embodiment. In FIG. 19, a memory cell MC1 of the second embodiment includes, a field-effect transistor that is a select transistor ST formed to a main surface of a semiconductor substrate 1S formed of, for example, single crystal silicon and selecting the memory cell MC1, and a memory unit MU formed above the select transistor. In the memory cell MC1, in accordance with a change of atom arrangement or atom location of the recording/reproducing film MRF included in the select transistor ST, the electric resistance of the recording/reproducing film MRF is changed between the low-resistance state and the high-resistance state to record information.

In the descriptions hereinafter, a state in which the resistance of the recording/reproducing film MRF is relatively low (low-resistance state) will be called "set state" and a state in which the resistance of the recording/reproducing film MRF is relatively high (high-resistance state) will be called "reset state". In addition, an operation of changing the recording/reproducing film MRF from the high-resistance state to the low-resistance state will be called "set operation" and an operation of changing the recording/reproducing film MRF from the low-resistance state to the high-resistance state will be called "reset operation".

Note that, while an example of using the semiconductor substrate 1S will be described in the second embodiment, instead of the semiconductor substrate 1S, a glass substrate or a substrate in which a semiconductor layer is formed on one of other various types of substrates may be used.

Hereinafter, a specific configuration of the memory cell MC1 according to the second embodiment will be described. As illustrated in FIG. 19, on a main surface of the semiconductor substrate 1S, a gate electrode GE is formed via a gate insulator GOX and a drain region DR and a source region SR are formed in the semiconductor substrate 1S so as to sandwich the gate electrode GE. The drain region DR, the source region SR, and the gate electrode GE form the select transistor ST formed of a field-effect transistor. In addition, to both sidewalls of the gate electrode GE, sidewall spacers SW are formed, and the sidewall spacers SW also form a part of the select transistor ST.

Although illustration is omitted in FIG. 19, the gate electrode GE is electrically connected to a word line formed of, for example, tungsten (W), and the drain region DR is electrically connected to a bit line BL via a wiring M1a (M1) and the memory unit MU as described below.

To the main surface of the semiconductor substrate 1S, a device isolation region STI is formed to be in contact with the drain region DR and the source region SR. On the semiconductor substrate 1S, an interlayer insulator ILD1 formed of, for example, silicon oxidized film is formed so as to cover the gate electrode GE and the device isolation region STI.

On the interlayer insulator ILD1, a wiring M1 formed of, for example, a metal film is formed, and the wiring M1 is electrically connected to the drain region DR or the source region SR via a contact plug CP1 formed to penetrating the interlayer insulator ILD1. The contact plug is formed of, for example, a tungsten film.

On the interlayer insulator ILD1, an interlayer insulator ILD2 formed of, for example, a silicon oxidized film is formed so as to cover the wiring M1. In the interlayer insulator ILD2, to an upper portion of the wiring M1a electrically connected to the drain region DR, a lower electrode BE is formed so as to penetrate the interlayer insulator ILD2. The lower electrode BE is electrically connected to the wiring M1a.

On the interlayer insulator ILD2, the recording/reproducing film MRF is formed. As the recording/reproducing film MRF, the $Sn_xTe_{100-x}/Sb_2Te_3$ SL film described in the first to fourth examples is used. The recording/reproducing film MRF is electrically connected to the lower electrode BE. That is, the recording/reproducing film MRF is electrically connected to the drain region DR via the lower electrode BE, the wiring M1a and the contact plug CP1. Also, on the recording/reproducing film MRF, an upper electrode UE is formed, and the upper electrode UE is electrically connected to the recording/reproducing film MRF. Further, the memory unit MU is composed of the lower electrode BE, the recording/reproducing film MRF, and the upper electrode UE, and the memory unit MU is electrically connected to the select transistor ST.

On the interlayer insulator ILD2, an interlayer insulator ILD3 formed of, for example, a silicon oxidized film is formed so as to cover the recording/reproducing film MRF and the upper electrode UE. In the interlayer insulator ILD3, to an upper portion of the upper electrode UE, a contact plug CP2 formed of, for example, tungsten is formed so as to penetrate through the interlayer insulator ILD3. The contact plug CP2 is electrically connected to the upper electrode UE.

On the interlayer insulator ILD3, a bit line BL formed of, for example, tungsten is formed. The bit line BL is electrically connected to the contact plug CP2. That is, the recording/reproducing film MRF is electrically connected to the bit line via the upper electrode UE and the contact plug CP2. Thus, the drain region DR of the select transistor ST is electrically connected to the bit line BL via the contact plug CP1, the wiring M1a, the lower electrode BE, the recording/reproducing film MRF, the upper electrode UE, and the contact plug CP2. Note that the bit line BL is further electrically connected to other circuits.

Note that, while an example of a cross-sectional view along the direction in which the bit line BL is extended is illustrated with respect to one memory cell MC1 in FIG. 19, in an actual case, a plurality of cells having the same configuration as the memory cell MC1 described above are arranged in an array in a plan view.

a. <Configuration of Memory Cell Array>

Figure 20:
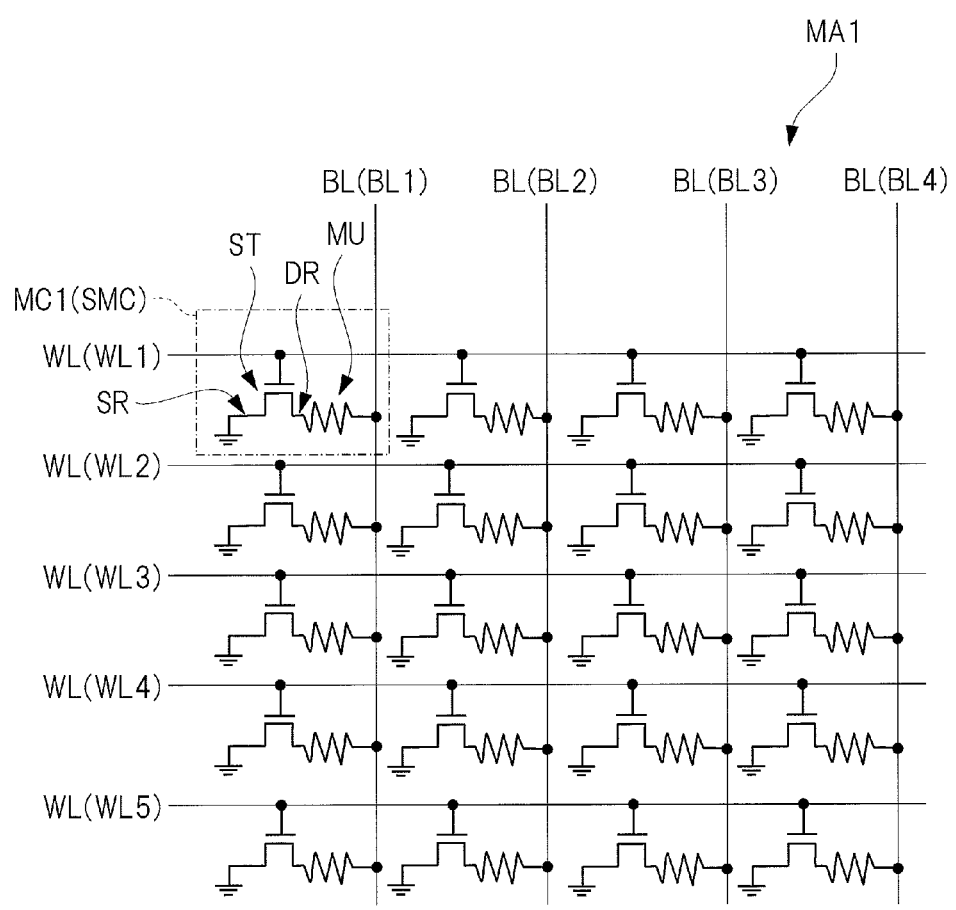
FIG. 20 is an equivalent circuit diagram illustrating a configuration example of a memory cell array of the semiconductor recording/reproducing device according to the second embodiment.

Next, a configuration example of the memory cell array of the semiconductor recording/reproducing device according to the second embodiment will be described. FIG. 20 is an equivalent circuit diagram illustrating a configuration example of the memory cell array MA1 of the semiconductor recording/reproducing device according to the second embodiment.

As illustrated in FIG. 20, the semiconductor recording/reproducing device according to the second embodiment includes a plurality of word lines WL (WL1 to WL5) extended in a first direction, a plurality of bit lines BL (BL1 to BL4) extended in a second direction that crosses the first direction, and the memory cell array MA1 including a plurality of the memory cells MC1 arranged in regions in which the word lines WL and the bit lines BL are crossed, respectively. Each of the plurality of memory cells MC1 includes the select transistor ST and the memory unit MU including the recording/reproducing film MRF. The drain region DR of the select transistor ST is electrically connected to the bit line BL via the memory unit MU. Also, the source region SR of the select transistor ST is grounded to, for example, a reference voltage (ground potential).

Note that, in FIG. 20, the memory unit MU including the recording/reproducing film MRF is illustrated as an electric resistance. In addition, to simplify the illustration, only one of the plurality of memory cells MC1 arranged in regions in which the word lines WL and the bit lines BL are crossed is denoted by the reference symbol in FIG. 20.

a. <Operation of Memory Cell Array>

The memory cell array MA1 according to the second embodiment is configured in the manner described in the following, and an operation of the memory cell array MA1 will be described hereinafter. As an example, a case of using the $Sn_xTe_{100-x}/Sb_2Te_3$ SL film where X=20 at. % described in the second example as the recording/reproducing film MRF will be described.

First, to the word line WL1 connected to the gate electrode GE of the memory cell MC1 that is a selective cell SMC, for example, 2 V is applied to turn on the select transistor ST of the selective cell SMC. In addition, to the bit line connected to the drain region DR of the selective cell SMC via the memory unit MU, for example, 1.85 V upon a reset operation and, for example, 0.1 V upon a reading operation, respectively. Further, the voltage of the word lines WL2, WL3, WL4 and WL5 except for the word line WL1 is set to, for example, 0 V, and the voltage of the bit lines BL2, BL3, and BL4 except for BL1 is set to, for example, 0 V.

Here, in the selective cell SMC, since the select transistor ST is in an on state, programming current flows in the recording/reproducing film MRF of the memory unit MU. In the reset operation, by current (programming current for reset operation) flowing in the recording/reproducing film MRF of the selective cell SMC of the selective cell SMC, thermal energy is applied to the recording/reproducing film MRF, thereby changing the atom array or atom location of the recording/reproducing film MRF. As a result, as the resistance value of the recording/reproducing film MRF is changed to the high-resistance state, the reset operation is completed. Meanwhile, upon the set operation, by the current flowing in the recording/reproducing film MRF of the selective cell SMC, thermal energy is applied to the recording/reproducing film MRF, thereby changing the atom array or atom location of the recording/reproducing film MRF. As a result, as the resistance value of the recording/reproducing film MRF is changed to the low-resistance state, the set operation is completed. Upon the reading operation, by determining a value of a current flowing in the recording/reproducing film MRF of the selective cell SMC, reading of information is carried out.

As compared to this, in the memory cells connected to any of the bit lines BL2, BL3, and BL4 and also connected to the word line WL1, the voltage of the bit lines BL2, BL3, and BL4 is 0 V and thus there is no voltage difference is between the two edges of the recording/reproducing film MRF; thus, no current flows in the recording/reproducing film MRF, posing no operation. In addition, in the memory cells connected to any of the bit lines BL1, BL2, BL3, and BL4 and also connected to any of the word lines WL2, WL3, WL4, and WL5, the select transistor ST is in an off state in which no current is flowing in the recording/reproducing film MRF, posing no operation. In this manner, in the memory cell array MA1, while the memory cells other than the selective cells SMC are put in an inactive state, subject selective cells SMC are put in an active state so that the reset operation, set operation, or reading operation can be carried out with respect to the selective cell SMC.

Note that, regarding the operations of the memory cell array MA1 described above, voltages to be applied to the word lines WL and bit lines BL have been specifically exemplified picking up an example of using the $Sn_xTe_{100-x}/Sb_2Te_3$ SL film as the recording/reproducing film MRF described in the second example. Thus, while specific values of voltage applied to the word lines WL and the bit lines BL are different in the cases of using the $Sn_xTe_{100-x}/Sb_2Te_3$ SL film described in the first, third, and fourth examples as the recording/reproducing film MRF, the basic operations of the memory cell array MA1 can be carried out in the same manner as that described above.

a. (Third Embodiment)

In a third embodiment, a mechanism on low switching power of a phase-change memory in which the $Sn_xTe_{100-x}/Sb_2Te_3$ SL film is used as the recording/reproducing film MRF will be explained and then a minimum value and a maximum value of X will be explained.

In the phase-change memory is used as the recording/reproducing film MRF, there are possibilities that (1) the phase-change memory is operated with low power by the side SnTe/$Sb_2Te_3$ superlattice phase and (2) the phase-change memory is operated with low power by the SnTe alloy phase. Hereinafter, each of the possibilities will be explained.

<Switching Mechanism on Low Switching Power by $Sn_xTe_{100-x}/Sb_2Te_3$ Superlattice Phase>

As an example, the case of X=20 at. % described in the second example will be explained.

First, to clarify the operation principle, a microcrystallographic analysis of the SnTe phase of the SnTe/$Sb_2Te_3$ superlattice phase (SnTe(111)/$Sb_2Te_3$(001) superlattice phase) was performed.

Figure 21A:
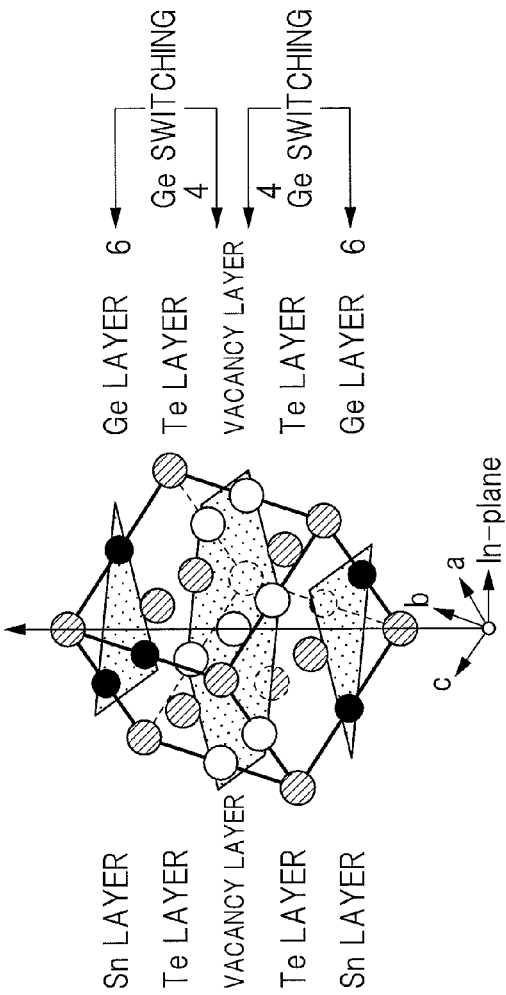
FIG. 21A is a diagram illustrating a crystalline structure of a SnTe lattice in a SnTe/Sb$_2$Te$_3$ superlattice (SL) phase.

The analysis procedure was as follows.

a. An experimental integral peak-intensity ratio $(I_{111}/I_{222})_{obs}$ were calculated from a peak corresponding to SnTe(111) and a peak corresponding to SnTe(222) in the enlarged XRD profiles illustrated in FIGS. 8A and 8B.

b. Conceivable vacancies were modelized by incorporating into the SnTe crystalline structure.

c. Regarding all the modelized SnTe crystalline structures, based on (Expression 1) and (Expression 2), a theoretical integral peak-intensity ratio $(\tilde{I}_{111}/\tilde{I}_{220})_{cal}$ was calculated.

$$I_{hkl} \approx |F_{hkl}|^2 \cdot LZ \cdot P \quad \text{(Expression 1)}$$
$$= |F_{hkl}|^2 \cdot P \cdot (1 + \cos^2 2\theta / \sin^2\theta \cdot \cos\theta)$$

$$F_{hkl} = \sum f_n \cdot \exp(2\pi i(hx(n) + ky(n) + lz(n))) \quad \text{(Expression 2)}$$

a. where b. $F_{hkl}$: Structure Factor c. LZ: Lorenz Polarization Factor
d. P: Multiplicity Factor
e. θ: Bragg Angle
f. $f_n$: Atomic Scattering Factor
g. n: Atomic Sort
h. h, k, l: Mirror Index
i. x, y, z: Order Parameter inside Crystalline Lattice of the Atom
j. An order parameter S expressed in (Expression 3) was calculated regarding all the modelized SnTe crystalline structures.

$$S^2 = (I_{111}/I_{222})_{obs}/(I_{111}/I_{222})_{cal} \quad \text{(Expression 3)}$$

a. A crystalline structure satisfying $0.7(\pm 0.1) \leq S \leq 1.0(\pm 0.1)$ in which crystals are ordered was searched for.
b. According to the analysis, it was indicated that the SnTe layer in the SnTe/$Sb_2Te_3$ superlattice phase had the crystalline structure illustrated in FIG. 21A. More specifically, as illustrated in FIG. 21A, in the SnTe layer, in the SnTe[111] direction that is a superlattice growth direction, the layers were deposited layer by layer in the order of "—Te layer-Sn layer-Te layer-vacancy layer-Te layer-Sn layer-Te layer"; and about 0.5 atom of Sn atom was mixed per one lattice on average in the vacancy layer. The $Sn_xTe_{100-x}/Sb_2Te_3$ SL film of the second example was deposited by a sputtering method and there is unevenness. This presence of unevenness means that there is a SnTe lattice in which Sn atom is not mixed and there is a SnTe lattice in which layers of "—Te layer-Sn layer-Te layer-vacancy layer-Te layer-Sn layer-Te layer" are deposited layer by layer in this order. This order of the layer-by-layer deposition is the same as that described in Reference 1 (Soeya et al., Journal of Applied Physics 112, 034301 (2012)), that is, "—Te layer-Ge layer-Te layer-vacancy layer-Te layer-Ge layer-Te layer" in a GeTe lattice in GeTe/$Sb_2Te_3$ superlattice. That is, the crystalline structure of the SnTe lattice illustrated in FIG. 21A is the same as that of the GeTe lattice illustrated in FIG. 21B.

Figure 21B:
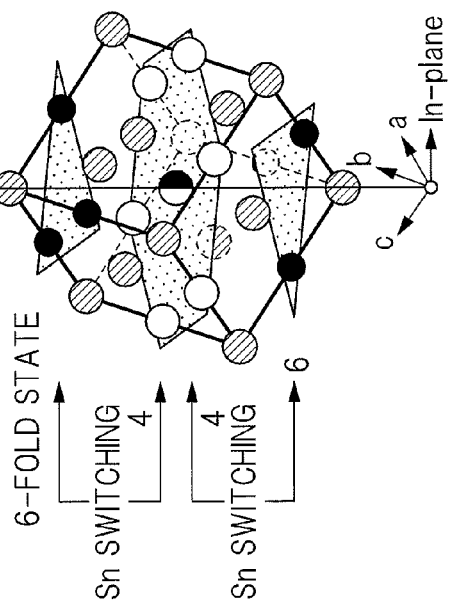
FIG. 21B is a diagram illustrating a crystalline structure of a GeTe lattice in a GeTe/Sb$_2$Te$_3$ SL phase.

According to Non-Patent Documents 1 and 2, in the GeTe/$Sb_2Te_3$ superlattice, in accordance with an applied voltage and an applied current, with using space called vacancy layer, the layer-by-layer deposition state of the layers in the GeTe [111] direction is changed between the 6-fold bond state (as-deposited state) of Ge atom in which the deposited state of the layers is "—Te layer-Ge layer-Te layer-vacancy layer-Te layer-Ge layer-Te layer" and the 4-fold bond state of Ge atom in which the deposited state of the layers is "—Te layer-vacancy layer-Te layer-Ge layer-Te layer-vacancy layer-Te layer", thereby achieving the low switching power (FIG. 21B). This phenomenon is called "Ge switching".

As described above, in the SnTe/$Sb_2Te_3$ superlattice phase, there is a SnTe lattice in which the layer-by-layer deposition state of the layers in the SnTe[111] direction is "—Te layer-Sn layer-Te layer-vacancy layer-Te layer-Sn layer-Te layer". Thus, by analogizing from the GeTe/$Sb_2Te_3$ superlattice, there is a possibility that, in accordance with an applied voltage and an applied current, with using space called vacancy layer, this SnTe lattice may be changed between the 6-fold bond state (as-deposited state) of Sn atom in which "—Te layer-Sn layer-Te layer-vacancy layer-Te layer-Sn layer-Te layer" and the 4-fold bond state of Sn atom in which "—Te layer-vacancy layer-Te layer-Sn layer-Te layer-vacancy layer-Te layer". That is, there is a possibility that a phenomenon called "Sn switching" in which Sn is inserted and desorbed in the vacancy layer is generated (FIG. 21A).

The SnTe/$Sb_2Te_3$ superlattice phase of the third embodiment has a layered structure of the SnTe lattice and the $Sb_2Te_3$ lattice, and when the "Sn switching" described above is developed in the SnTe lattice, it is considered that a volume change of the SnTe lattice is posed by a difference made in the array location of Sn atoms. In this case, it is considered that a van der Waals gap layer (Te—Te weak bond layer) is present in the $Sb_2Te_3$ lattice and this van der Waals gap layer absorbs the volume change of the SnTe lattice. That is, to obtain the "Sn switching" developed in the SnTe/$Sb_2Te_3$ superlattice phase, while it is needed to absorb the volume change of the SnTe lattice, the van der Waals gap layer in the SnTe/$Sb_2Te_3$ is considered to function as a buffer layer which absorbs the volume change. Thus, it is considered to be possible to obtain the "Sn switching" developed in the SnTe/$Sb_2Te_3$ superlattice phase.

Particularly, in the second example, the SnTe/$Sb_2Te_3$ superlattice phase is considered to be diluted by the SnSbTe alloy phase and the Te phase. When the SnTe/$Sb_2Te_3$ superlattice phase is diluted in this manner, places for the "Sn switching" to develop is decreased. Thus, there is a possibility that the low switching power generated in the phase-change memory in which the $Sn_xTe_{100-x}/Sb_2Te_3$ superlattice film is used as the recording/reproducing film MRF may be generated in the SnTe/$Sb_2Te_3$ superlattice phase, in which the "Sn switching" is developed, is diluted by the SnSbTe alloy phase and the Te phase. When such an operation mechanism is being developed, it is considered to be possible to achieve the low switching power of the phase-change memory if at least the SnTe/$Sb_2Te_3$ superlattice phase is present in the recording/reproducing film MRF.

Note that, while the second example in which X=20 at. % has been exemplified here, it can be considered that the same may goes to the first example in which X=35 at. %, the third example in which X=10 at. %, and the fourth example in which X=5 at. %.

a. <Mechanism on Low Switching Power by SnSbTe Alloy Phase>

Figure 22:
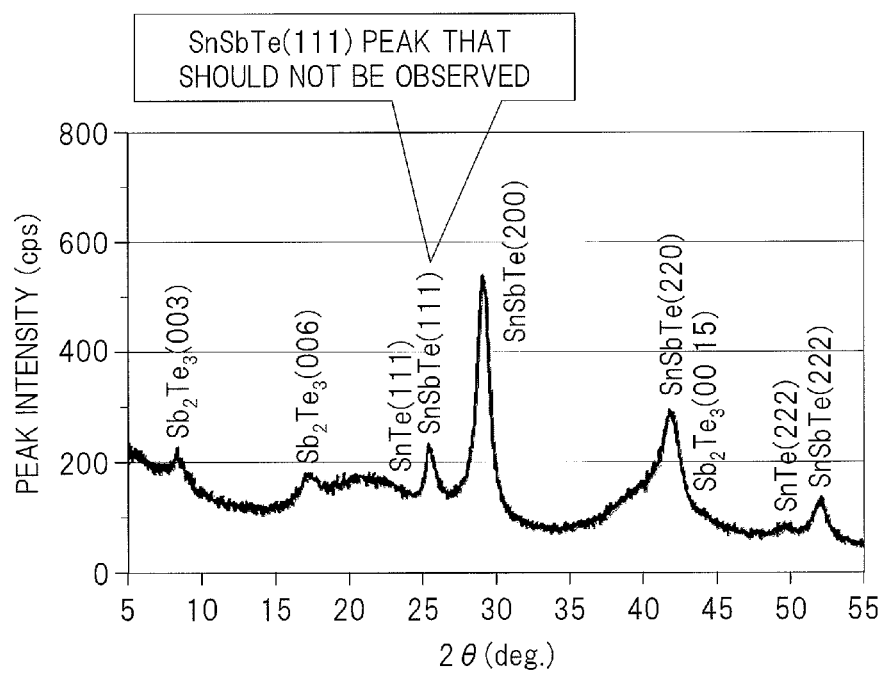
FIG. 22 is a diagram illustrating an XRD profile of a Sn$_x$Te$_{100-x}$/Sb$_2$Te$_3$ SL film where X=50 at. %.

FIG. 22 is a diagram illustrating an XRD profile of the $Sn_xTe_{100-x}/Sb_2Te_3$ superlattice phase film where X=50 at. %. As illustrated in FIG. 22, in the $Sn_xTe_{100-x}/Sb_2Te_3$ superlattice film where X=50 at. %, it is presumed that the SnTe/$Sb_2Te_3$ superlattice phase and the SnSbTe alloy phase having a NaCl-type crystalline structure (face centered cubic (fcc) structure) are present together.

From a study on the result illustrated in FIG. 22, it was revealed that there was a peak corresponding to SnSbTe(111) which should not have been observed. More specifically, in the sputtering method of manufacturing the $Sn_xTe_{100-x}/Sb_2Te_3$ superlattice film where X=50 at. %, in the deposition of the $Sn_xTe_{100-x}/Sb_2Te_3$ superlattice film as an integrated film without using the layer-by-layer deposition as illustrated in FIG. 2, the peak corresponding to SnSbTe(111) is not present. It may mean that the SnSbTe alloy phase has the NaCl-type crystalline structure.

Specifically, the relatively theoretical integral peak-intensity $I_{III}$ corresponding to SnSbTe(111) is given by the following (Expression 4).

$$I_{111} \approx |4f_{(Sn,Sb)} - 4f_{Te}|^2 \cdot LZ \cdot P \quad \text{(Expression 4)}$$

Here, in a simple NaCl-type structure, since the relation is $f_{Sn} \approx f_{Sb} \approx f_{Te}$, $I_{111} \approx 0$. That is, in the simple NaCl-type structure, the peak corresponding to SnSbTe(111) should not be observed.

Meanwhile, the inventors have found out that, when the $Sn_xTe_{100-x}/Sb_2Te_3$ superlattice film (X=50 at. %) and a SnTe/$Sb_2Te_3$ film are deposited by layer by layer as independent separate films as illustrated in FIG. 2, the peak corresponding to SnSbTe(111) that should not be observed is present as illustrated in FIG. 22. This means that there is a possibility indicating that forming the SnJe$_{100-x}$/Sb$_2$Te$_3$ superlattice film in the case of X=50 at. % by the method of layer-by-layer deposition illustrated in FIG. 2, the SnSbTe alloy phase is in another crystalline structure different from the simple NaCl-type crystalline structure.

Accordingly, the inventors have searched for a SnSbTe alloy phase which permits SnSbTe(111). An analysis procedure of the search was as follows.

An experimental integral peak-intensity ratio $(I_{111}/I_{222})_{obs}$ were calculated from a peak corresponding to SnSbTe(111) and a peak corresponding to SnSbTe(222) in the enlarged XRD profiles illustrated in FIG. 22.

a. (2) Conceivable vacancies were modelized by incorporating into the SnSbTe crystalline structure.
b. (3) Regarding all the modelized SnSbTe crystalline structures, based on (Expression 1) and (Expression 2) described above, a theoretical integral peak-intensity ratio $(I_{111}/I_{222})_{cal}$ was calculated.
c. (4) An order parameter S expressed in (Expression 3) was calculated regarding all the modelized SnSbTe crystalline structures.
d. A crystalline structure satisfying $0.7(\pm 0.1) \leq S \leq 1.0(\pm 0.1)$ in which crystals are ordered was searched for.

Figures 23A, 23B:
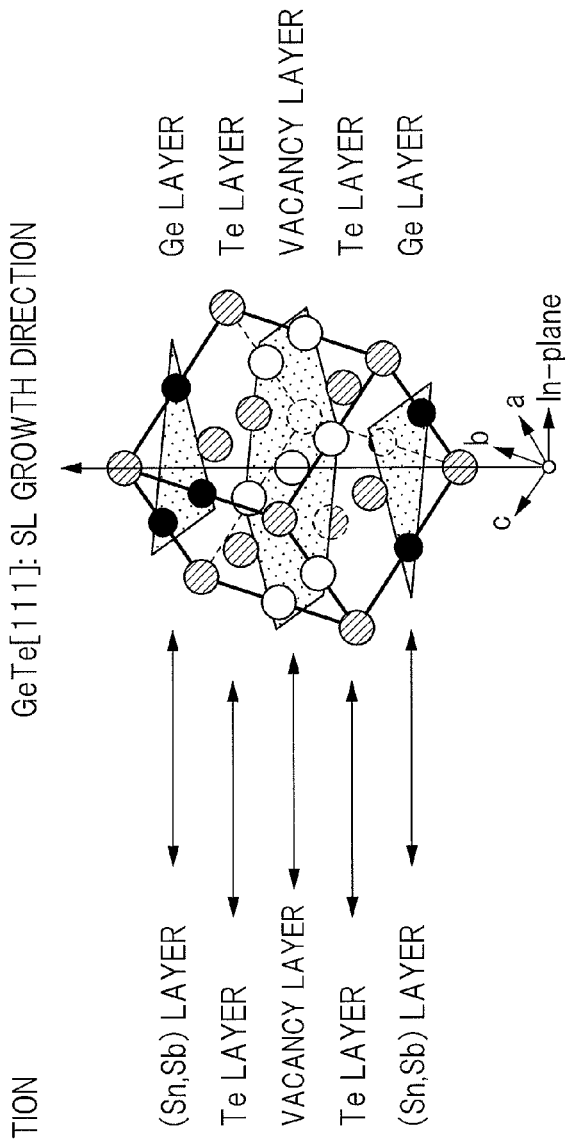
FIG. 23A is a diagram illustrating a crystalline structure of a SnSbTe alloy phase in the Sn$_x$Te$_{100-x}$/Sb$_2$Te$_3$ SL film where X=50 at. %.
FIG. 23B is a diagram illustrating a crystalline structure of a GeTe lattice in a GeTe/Sb$_2$Te$_3$ SL film.

According to this analysis, it has been revealed that there is a high possibility that the lattice of the SnSbTe alloy phase has a crystalline structure in which a vacancy layer is introduced inside the lattice instead of the simple NaCl-type crystalline structure. More specifically, the SnSbTe alloy phase contained in the Sn$_x$Te$_{100-x}$/Sb$_2$Te$_3$ superlattice phase film where X=50 at. % has the crystalline structure illustrated in FIG. 23A. More specifically, it has been revealed that, as illustrated in FIG. 23A, the SnSbTe alloy phase has a crystalline structure in which layers of "—Te layer-(Sn, Sb) layer-Te layer-vacancy layer-Te layer-(Sn, Sb) layer-Te layer-" are deposited layer by layer in the superlattice growth direction that is SnSbTe[111] direction in this order. This crystalline structure is the same as the crystalline structure of the GeTe lattice inside the GeTe/Sb$_2$Te$_3$ superlattice phase in which layers of "—Te layer-Ge layer-Te layer-vacancy layer-Te layer-Ge layer-Te layer-" are deposited layer by layer in this order in the superlattice growth direction that is GeTe[111] direction. In other words, the crystalline structure of the lattice of the SnSbTe alloy phase illustrated in FIG. 23A is the same as the crystalline structure of the GeTe lattice illustrated in FIG. 23B.

Figure 24:
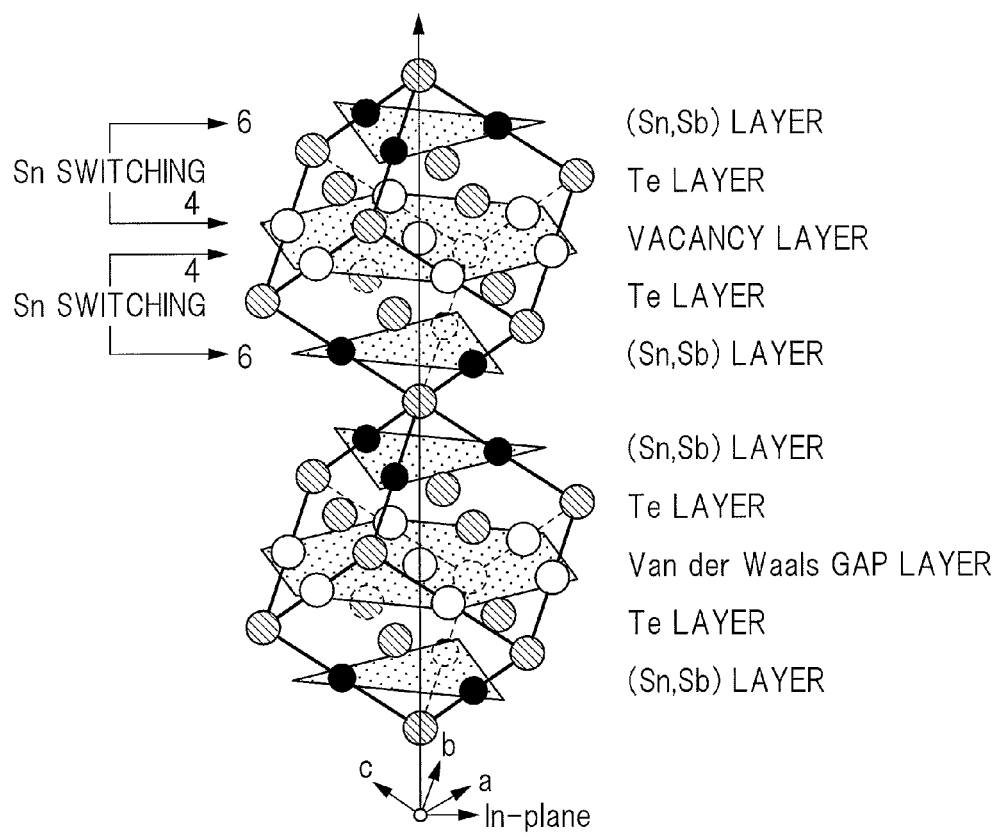
FIG. 24 is a diagram illustrating a structure in which two crystalline structures of the SnSbTe alloy phase illustrated in FIG. 23A are stacked in a superlattice (SL) growth direction that is SnSbTe[111] direction.

FIG. 24 is a diagram illustrating a structure in which two structures of the crystalline structure of the SnSbTe alloy phase illustrated in FIG. 23A are stacked in the superlattice growth directions that is SnSbTe[111] direction. From a presumption from the structure of the GeTe/Sb$_2$Te$_2$ superlattice phase illustrated in FIG. 23B, the SnSbTe alloy phase is in the superlattice structure including a van der Waals gap layer, that is, a space layer that is important for the vacancy layer included in the upper side of the crystalline structure to achieve the "Sn switching" but also the van der Waals gap layer is a space needed to make the van der Waals gap layer function as a buffer layer which absorbs a volume change upon the "Sn switching" in the lower side crystalline structure.

Thus, there is a possibility in the lattice of the SnSbTe alloy phase that, in accordance with an applied voltage and an applied current, with using space called vacancy layer, the stacked state of the layers is changed between the 6-fold bond state (as-deposited state) of Sn atoms in which the state is "—Te layer-(Sn, Sb) layer-Te layer-vacancy layer-Te layer-(Sn, Sb) layer-Te layer" and the 4-fold bond state of Sn atoms in which the stacked state of the layers is "—Te layer-vacancy layer-Te layer-(Sn, Sb) layer-Te layer-vacancy layer-Te layer". That is, in the vacancy layer being present in the SnSbTe alloy phase, the "Sn switching" in which Sn is inserted and desorbed is possibly posed.

The foregoing has been a discussion on the NaCl-type crystalline structure of the SnSbTe alloy phase in the Sn$_x$Te$_{100-x}$/Sb$_2$Te$_3$ superlattice phase film where X=50 at. %, and an operation principle of the phase-change memory in which the Sn$_x$Te$_{100-x}$/Sb$_2$Te$_3$ SL phase film were X=50 at. % is used. This discussion can be also analogically applied to the crystalline structure of the SnSbTe alloy phase of hcp hexagonal crystal in the Sn$_x$Te$_{100-x}$/Sb$_2$Te$_3$ SL film described in the first to fourth examples and the principle of low switching power of the phase-change memory in which the Sn$_x$Te$_{100-x}$/Sb$_2$Te$_3$ SL film described in the first to fourth examples are used. This point will be explained hereinafter.

Figure 25:
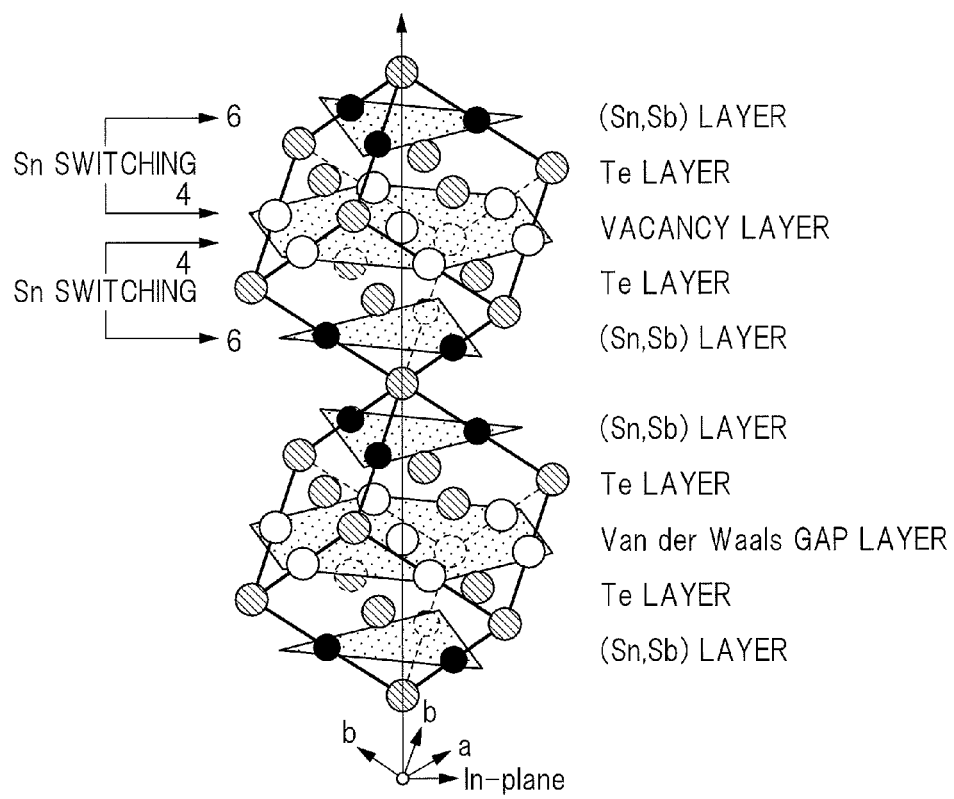
FIG. 25 is a diagram illustrating a crystalline structure in [001] direction of the SnSbTe alloy phase of a hexagonal closed packed crystalline lattice.

First, FIG. 25 is a diagram illustrating a crystalline structure of the hcp hexagonal crystal in the SnSbTe alloy phase in [001] direction. The orders of stacking in the closed packed crystal sheet direction of the fcc (face centered cubic) structure that is a face-centered cubic lattice structure and the hcp (hexagonal closest packed) structure that is a hexagonal close-packed lattice structure are analogous, and the fcc structure becomes like the hcp structure when its coordinate is transferred; these are known facts. There are fourteen types of Bravais lattices and the NaCl structure of FIG. 24 is classified into the fcc structure. On the contrary, when the coordinate of the fcc structure of FIG. 24 is transferred, it becomes like the hcp structure of FIG. 25.

As illustrated in FIG. 25, in the SnSbTe alloy phase, while the vacancy layer included in the crystalline structure on the upper side is an important space layer upon the "Sn switching", there is a high possibility that the crystalline structure of the lower side is in the superlattice structure including the van der Waals gap layer that is a needed space for functioning as a buffer layer for absorbing the volume change upon "Sn switching".

Thus, also in the lattice of the SnSbTe alloy phase of the hcp hexagonal crystal, in accordance with an applied voltage and an applied current, using the space that is the vacancy layer, there is a possibility that the stacked structure is changed between the 6-fold bond state (as-deposited state) of Sn atoms in the state of "—Te layer-(Sn, Sb) layer-Te layer-vacancy layer-Te layer-(Sn, Sb) layer-Te layer" and the 4-fold bond state of Sn atoms in the state of "—Te layer-vacancy layer-Te layer-(Sn, Sb) layer-Te layer-vacancy layer-Te layer-". That is, also in the SnSbTe alloy phase of the hcp hexagonal crystal, there is a possibility of the "Sn switching" by insertion and desorption of Sn is posed in the vacancy layer.

In the Sn$_x$Te$_{100-x}$/Sb$_2$Te$_3$ SL films described in the first to fourth examples, it is considered that the SnSbTe alloy phase of the hcp hexagonal crystal is the most dominant. Thus, it is not an exaggeration to say that the most part of the sheet, in the Sn$_x$Te$_{100-x}$/Sb$_2$Te$_3$ SL films described in the first to fourth examples, is derived from the SnSbTe alloy phase having the crystalline structure of FIG. 25. Accordingly, there is a possibility that, when the value X is decreased, the number of Sn atoms to be in the "Sn switching" is decreased in the (Sn, Sb) layer, thereby reducing the switching power. In other words, as a result of decreasing the number of Sn atoms to be involved in the "Sn switching" in the (Sn, Sb) layer by decreasing X, there is a possibility that the phase-change memory in which the Sn$_x$Te$_{100-x}$/Sb$_2$Te$_3$ SL film of the first to fourth examples is used is operated with a low switching power. When such an operation mechanism is expressed, it is considered that the low-switching power of the phase-change memory can be achieved when at least the SnSbTe alloy phase is present in the recording/reproducing film.

In the foregoing, while the possibility of "Sn switching" posed in the SnTe/$Sb_2Te_3$ superlattice phase and the possibility of the "Sn switching" posed in the SnSbTe alloy phase have been explained in accordance with the low-switching-power mechanism, both of the possibilities are conceivable.

a. <Minimum Value of X>

Next, the minimum value of X will be explained. For example, you may suppose that, when the "Sn switching" is being generated in the SnSbTe alloy phase, the "Sn switching" occurs no matter how much the amount of Sn atoms is decreased and there is no ceasing to fall of the low switching power. However, this is not the case. The "Sn switching" in the SnSbTe alloy phase is posed when Sn atoms are shifted from the 6-fold bond state and the 4-fold bond state in accordance with an applied voltage and an applied current. Therefore, the "Sn switching" never occurs unless there is one Sn atom per one sublattice at minimum. As illustrated in FIG. 25, when one sublattice is organized as the hcp structure, the sublattice is composed of 27 atoms including vacancy sites. Therefore, the minimum value of X is expressed as X=(the number of Sn atoms: one)/(the total number of atoms per one sublattice: 27)≈3.7, i.e., 4 at. % since a decimal number cannot be applied.

a. <Maximum Value of X>

Figure 26A:
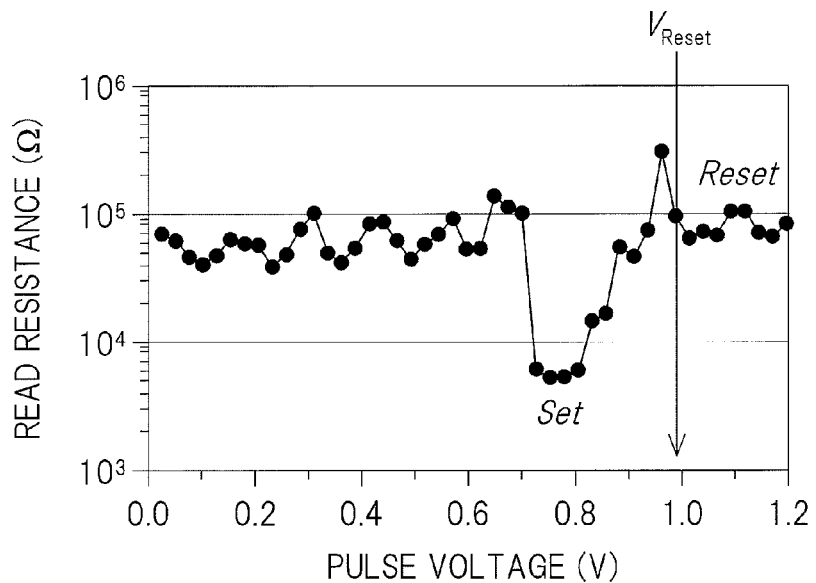
FIG. 26A is a diagram of an experiment result illustrating a pulse-voltage dependency of a read resistance of the phase-change memory.

Subsequently, a maximum value of X will be explained. FIG. 26A is a diagram of an experiment result illustrating a pulse-voltage dependency of a read resistance of the phase-change memory in which the $Sn_xTe_{100-x}/Sb_2Te_3$ SL film where X=50 at. % is used; and FIG. 26B is a diagram of an experiment result illustrating a dynamic-current dependency of a read resistance of the phase-change memory in which the phase-change memory using the $Sn_xTe_{100-x}/Sb_2Te_3$ SL film where X=50 at. % is used.

Figure 26B:
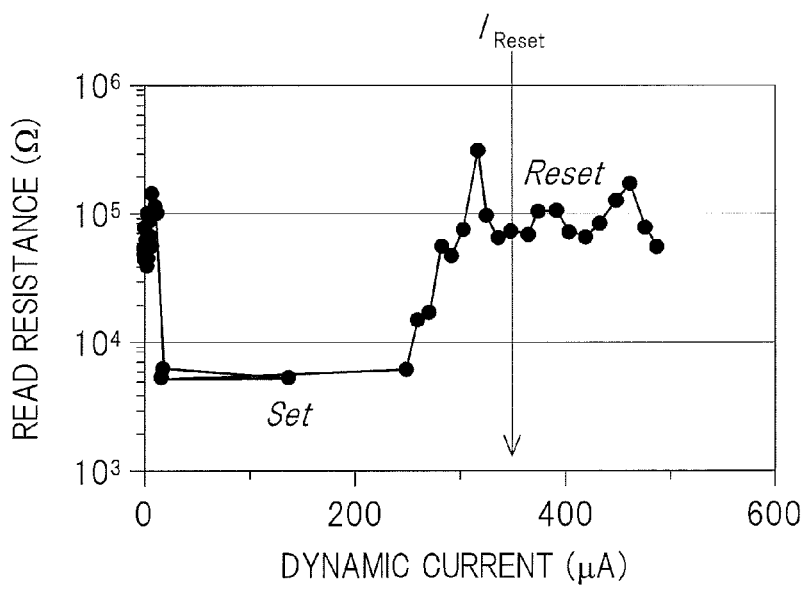
FIG. 26B is a diagram of an experiment result illustrating a dynamic-current dependency of a read resistance of the phase-change memory in which the Sn$_x$Te$_{100-x}$/Sb$_2$Te$_3$ SL film where X=50 at. % is used.

As illustrated in FIGS. 26A and 26B, it can be confirmed that the reset voltage was about 1.0V and the reset current was about 340 μA. The switching power calculated by multiplying the reset voltage by the reset current was about 340 μW. This value is about one twentieth (1/20) of the switching power (about 6080 W) of the GST225 that was manufactured and measured in the same manner. In other words, the phase-change memory in which the $Sn_xTe_{100-x}/Sb_2Te_3$SL film where X=50 at. % is used can reduce consumed power to about 1/20 as compared with the GST225. This value is more superior than the value of about 1/10 of the phase-change memory in which GeTe/$Sb_2Te_3$ SL film described in Non-Patent Documents 1 and 2.

Further, consumed power of the phase-change memories described in the first to fourth examples is about 1/50, about 1/250, about 1/2100, and about 1/7070, respectively, and thus it is understood that consumed power of phase-change memory is reduced when the value of X is decreased from X=50 at. %.

Figure 27:
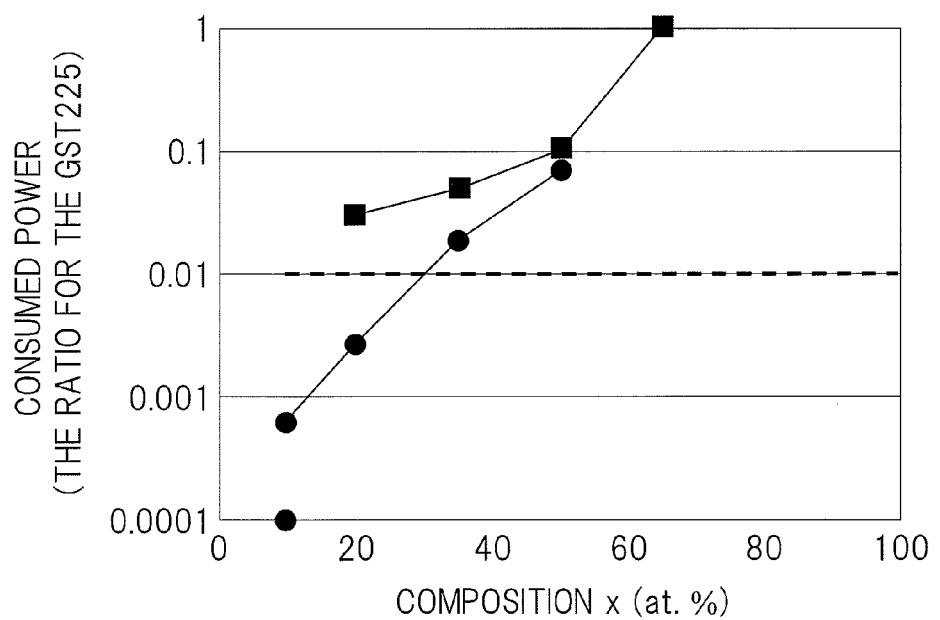
FIG. 27 is a graph illustrating a dependency of consumed power to the composition ratio X of the phase-change memory using the Sn$_x$Te$_{100-x}$/Sb$_2$Te$_3$ SL film as compared with that of GST225, and also illustrating a dependency of consumed power to the composition ratio X of the phase-change memory using the $Ge_xTe_{100-x}/Sb_2Te_3$ SL film as compared with that of GST225.

FIG. 27 is a graph illustrating a dependency of consumed power to the composition ratio X of the phase-change memory using the $Sn_xTe_{100-x}/Sb_2Te_3$ SL film as compared with that of GST225, and also illustrating a dependency of consumed power to the composition ratio X of the phase-change memory using the $Ge_xTe_{100-x}/Sb_2Te_3$ SL film as compared with that of GST225.

The mark (black circle) ● indicates the phase-change memory in which the $Sn_xTe_{100-x}/Sb_2Te_3$ SL film is used, and the mark ■ (black square) indicates the phase-change memory in which the $Ge_xTe_{100-x}/Sb_2Te_3$ SL film. As illustrated in FIG. 27, the more the composition ratio X is decreased from X=50 at. %, the more the consumed power of the phase-change memory in which the $Sn_xTe_{100-x}/Sb_2Te_3$ SL film is used is reduced. In addition, it is understood that, at the value X=50 at. %, consumed power of the $Sn_xTe_{100-x}/Sb_2Te_3$ SL film is already lower than that of the phase-change memory in which the $Ge_xTe_{100-x}/Sb_2Te_3$ SL film is used. According to the foregoing, the maximum value of X is at least 50 at. %.

Figure 28:
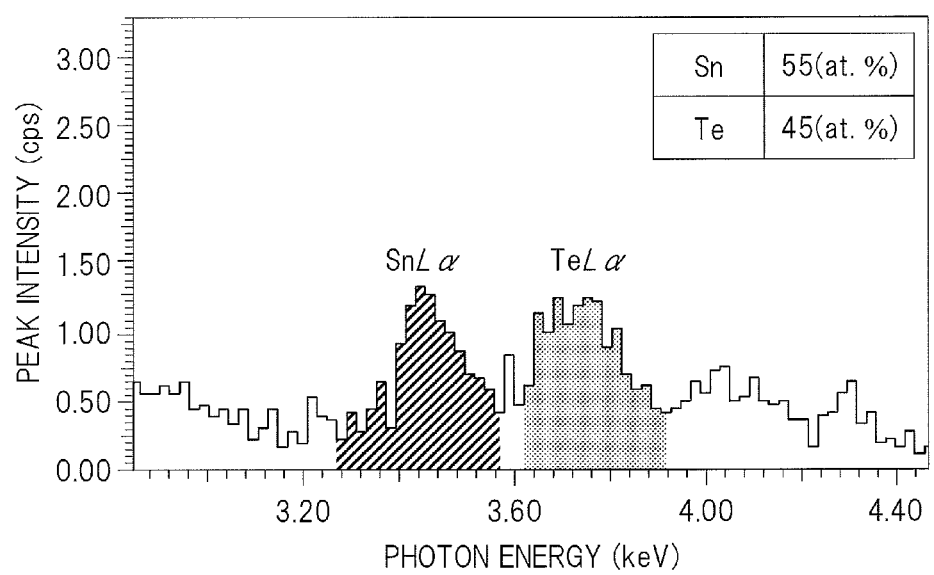
FIG. 28 is a diagram illustrating a result of a composition analysis of a single $Sn_{50}Te_{50}$ film carried out using an XRF-EDX apparatus (EDX: x-ray fluorescence spectrometry, EDX: energy dispersive x-ray spectrometry)

Note that, a composition analysis of $Sn_{50}Te_{50}$ was performed using x-ray fluorescence spectrometers. As a result, as illustrated in FIG. 28, the composition Sn:Te≈55:45 was confirmed. In light of the result, the maximum value of X is 55 at. %.

According to the foregoing, the minimum value of X is X=4 at. % and the maximum value of X=55 at. %. Thus, by setting the composition ratio X of the $Sn_xTe_{100-x}/Sb_2Te_3$ SL film in the range of 4 at. %≤X≤55 at. %, the phase-change memory in which the $Sn_xTe_{100-x}/Sb_2Te_3$ SL film is used can reduce the switching power and consumed power as compared with the existing phase-change memories.

However, since performance of the phase-change memory in which the $Sn_xTe_{100-x}/Sb_2Te_3$ SL film where X=50 at. % is not much more than that of the phase-change memory in which the $Ge_xTe_{100-x}/Sb_2Te_3$ SL film is used, X is preferable to be in the range of X≤50 at. %.

In this manner, by setting the value X of the $Sn_xTe_{100-x}/Sb_2Te_3$ SL film in the range of 4 at. %≤X≤55 at. %, consumed power of the phase-change memory according to the present invention can be reduced. That is, by using the phase-change memory according to the present invention to memory cells of a semiconductor recording/reproducing device, a semiconductor recording/reproducing device with reduced consumed power can be provided.

a. <Endurance>

Lastly, endurance of a phase-change memory of the present invention will be explained.

Figure 29A:
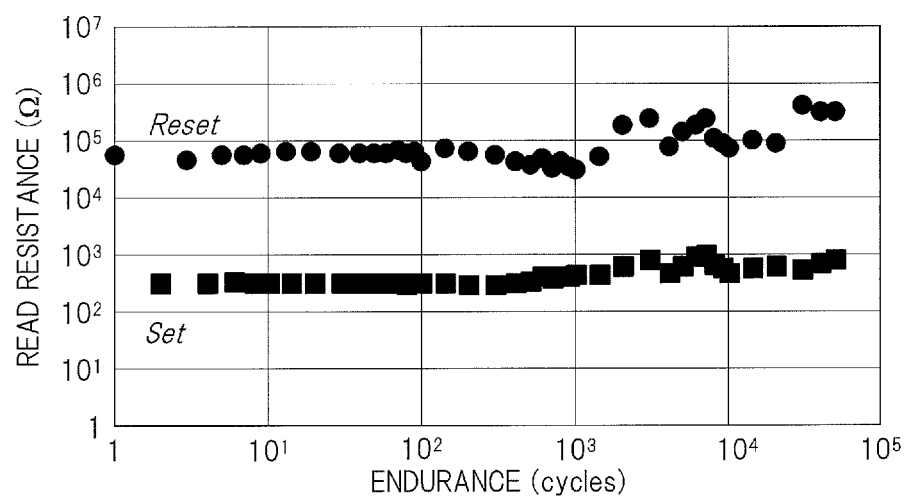
FIG. 29A is a graph illustrating endurance of the phase-change memory using the $Sn_xTe_{100-x}/Sb_2Te_3$ SL film where X=35 at. %.

FIG. 29A is a graph illustrating endurance of the phase-change memory in which the $Sn_xTe_{100-x}/Sb_2Te_3$ SL film where X=35 at. % is used. As illustrated in FIG. 29A, it was confirmed that the endurance was about $10^8$ at least. The reason that the resistance values in set state and the reset state in FIG. 29A are different from those in FIG. 6 is that the probers used in the evaluation of electrical characteristics were different.

Figure 29B:
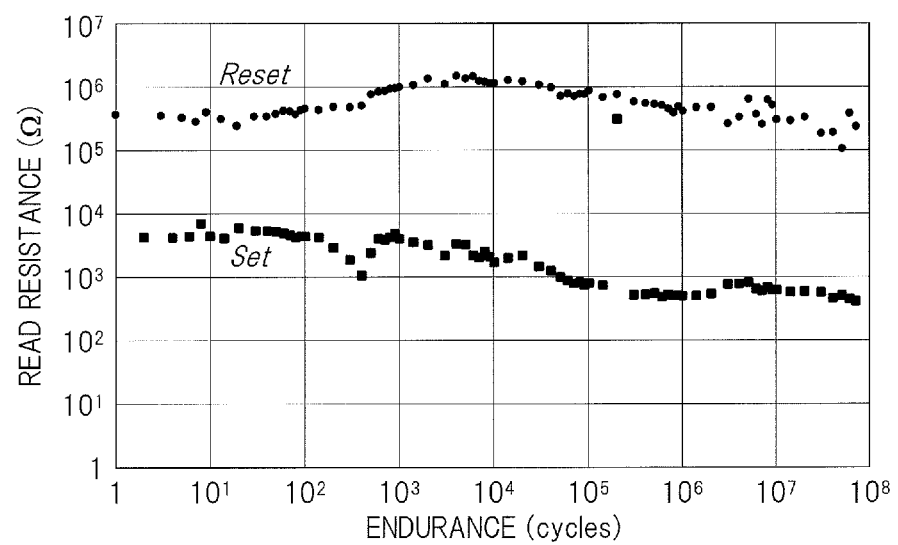
FIG. 29B is a graph illustrating endurance of the phase-change memory using the $Sn_xTe_{100-x}/Sb_2Te_3$ SL film where X=50 at. %.

FIG. 29B is a graph illustrating endurance of the phase-change memory in which the $Sn_xTe_{100-x}/Sb_2Te_3$ SL film where X=50 at. % is used. As illustrated in FIG. 29B, it was confirmed that endurance was about $10^8$ at least. The reason that the resistance values in set state and the reset state in FIG. 29A are different from those in FIG. 26 is that the probers used in the evaluation of electrical characteristics were different.

While the foregoing has been mentioned only endurance with X=35 at. % and 50 at. %, also in the cases of using X=5 at. %, 10 at. %, and 20 at. %, and further in the range of 4 at. %≤X≤55 at. %, it is considered that the same endurance can be obtained.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, while the example of forming the seed layer SDL by a TiN film has been described in the first embodiment, the example is not limited to this and the seed layer SDL may include, for example, a TiN (titanium nitride) film, TaN (tantalum nitride) film, ReO$_3$ (rhenium oxide) film, TiO (titanium oxide) film, NbO (niobium oxide) film, MoO$_3$ (molybdenum trioxide) film, RuO$_2$ (ruthenium oxide) film, MoO$_2$ (molybdenum dioxide) film, WO$_2$ (tungsten oxide) film, RhO$_2$ (rhodium oxide) film, PtO$_2$ (platinum oxide) film, NiO (nickel oxide) film, or CoO (cobalt oxide) film. Further, the seed layer SDL may be formed of, for example, a Ta/Cu film, a Ta/NiFe film, a Ta/Ni film, a Ta/Co film, or a Ta/CoFe film.

The present invention can be widely used in manufacturing field of manufacturing semiconductor recording/reproducing device including a phase-change memory. Note that, there is a strong possibility that phase-change memory of the present invention will be used in semiconductor recording/reproducing devices instead of the phase-change memory memories which are currently in practical use represented by the GST225.

While the present invention has been illustrated and described with respect to a particular embodiment thereof, it should be appreciated by those of ordinary skill in the art that various modifications to this invention may be made without departing from the spirit and scope of the present.

What is claimed is:

1. A phase-change memory comprising a recording/reproducing film containing Sn (tin), Sb (antimony), and Te (tellurium),
   wherein the recording/reproducing film contains:
   a SnTe/Sb$_2$Te$_3$ superlattice phase formed of SnTe and Sb$_2$Te$_3$;
   a SnSbTe alloy phase; and
   a Te phase.

2. The phase-change memory according to claim 1,
   wherein an under layer containing Sb$_2$Te$_3$ is formed below the recording/reproducing film.

3. The phase-change memory according to claim 2,
   wherein a seed layer is formed below the under layer.

4. The phase-change memory according to claim 3,
   wherein the seed layer includes TiN (titanium nitride) film, TaN (tantalum nitride) film, ReO$_3$ (rhenium oxide) film, TiO (titanium oxide) film, NbO (niobium oxide) film, MoO$_3$ (molybdenum trioxide) film, RuO$_2$ (ruthenium oxide) film, MoO$_2$ (molybdenum dioxide) film, WO$_2$ (tungsten oxide) film, RhO$_2$ (rhodium oxide) film, PtO$_2$ (platinum oxide) film, NiO (nickel oxide) film, or CoO (cobalt oxide) film.

5. The phase-change memory according to-claim 1,
   wherein the SnSbTe alloy phase is in a superlattice structure.

6. The phase-change memory according to claim 5,
   wherein the superlattice structure includes at least a structure in which a first portion lattice including a van der Waals gap layer and a second portion lattice including a vacancy layer are neighboring in a superlattice growth direction.

7. The phase-change memory according to claim 6,
   wherein the vacancy layer functions as a layer in which Sn is inserted and desorbed, and
   the van der Waals gap layer functions as a buffer layer for mitigating a volume change caused by insertion and desorption of Sn in the vacancy layer.

8. The phase-change memory according to claim 1,
   wherein the recording/reproducing film has a structure in which the SnTe/Sb$_2$Te$_3$ superlattice phase is spread in a matrix formed of a SnSbTe alloy phase and a Te phase.

9. A phase-change memory comprising a recording/reproducing film containing Sn (tin), Sb (antimony), and Te (tellurium) and obtained by depositing a Sn$_x$Te$_{100-x}$ film and a Sb$_2$Te$_3$ film layer by layer,
   wherein the recording/reproducing film contains:
   a SnTe/Sb$_2$Te$_3$ superlattice phase formed of SnTe and Sb$_2$Te$_3$;
   a SnSbTe alloy phase; and
   a Te phase.

10. The phase-change memory according to claim 9,
    wherein the value X of the Sn$_x$Te$_{100-x}$ film is represented by 4 at.% ≤X ≤50 at.%.

11. The phase-change memory according to claim 9,
    wherein the value X of the Sn$_x$Te$_{100-x}$ film is represented by 4 at.% ≤X ≤55 at.%.

12. The phase-change memory according to claim 9,
    wherein the value X of the Sn$_x$Te$_{100-x}$ film is any one of 5 at.%, 10 at.%, 20 at.%, 35 at.%, and 50 at.%.

13. The phase-change memory according to claim 9,
    wherein a thickness of the Sn$_x$Te$_{100-x}$ film is 1nm, and a thickness of the Sb$_2$Te$_3$ film is 4nm.

14. A semiconductor recording/reproducing device comprising a plurality of memory cells,
    wherein each of the memory cells includes:
    (a) a select transistor for selecting a memory cell; and
    (b) a memory potion including a recording/reproducing film electrically connected to the select transistor and containing Sn (tin), Sb (antimony), and Te (tellurium), and
    the recording/reproducing film contains:
    a SnTe/Sb$_2$Te$_3$ superlattice phase formed of SnTe and Sb$_2$Te$_3$;
    a SnSbTe alloy phase; and
    a Te phase.

15. A semiconductor recording/reproducing device comprising a plurality of memory cells,
    wherein each of the memory cells includes:
    (a) a select transistor for selecting a memory cell; and
    (b) a memory unit electrically connected to the select transistor and including a recording/reproducing film containing Sn, Sb, and Te and obtained by depositing a Sn$_x$Te$_{100-x}$ film and an Sb$_2$Te$_3$ film layer by layer, and
    the recording/reproducing film contains:
    a SnTe/Sb$_2$Te$_3$ superlattice phase formed of SnTe and Sb$_2$Te$_3$;
    a SnSbTe alloy phase; and
    a Te phase.

16. The semiconductor recording/reproducing device according to claim 15,
    wherein the value X of the Sn$_x$Te$_{100-x}$ film is represented by 4 at.% ≤X ≤50 at.%.

* * * * *